United States Patent
Chaug et al.

(10) Patent No.: US 7,156,945 B2
(45) Date of Patent: *Jan. 2, 2007

(54) PROCESS FOR FORMING A PATTERNED THIN FILM STRUCTURE FOR IN-MOLD DECORATION

(75) Inventors: Yi-Shung Chaug, Cupertino, CA (US); Xiaojia Wang, Fremont, CA (US); Sean Kiluk, Pleasanton, CA (US); Scott Tseng, San Jose, CA (US); Hongmei Zang, Sunnyvale, CA (US); Rong-Chang Liang, Cupertino, CA (US)

(73) Assignee: SiPix Imaging, Inc., Fremont, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 10/665,992

(22) Filed: Sep. 19, 2003

(65) Prior Publication Data

US 2004/0112237 A1    Jun. 17, 2004

Related U.S. Application Data

(63) Continuation-in-part of application No. 10/422,557, filed on Apr. 23, 2003.

(60) Provisional application No. 60/375,902, filed on Apr. 24, 2002.

(51) Int. Cl.
*B05D 1/32* (2006.01)
*B05D 3/10* (2006.01)
*B05D 5/12* (2006.01)
*H01L 21/31* (2006.01)
*H01L 21/36* (2006.01)
*B32B 31/10* (2006.01)
*B32B 43/00* (2006.01)
*B05C 11/11* (2006.01)

(52) U.S. Cl. ............ 156/344; 427/272; 427/282; 438/478; 438/759; 438/763

(58) Field of Classification Search ............ 156/247, 156/277, 278, 344, 584; 427/154–156, 272–274, 427/282; 101/128.21, 129, 114; 118/504; 438/478, 479, 759, 763

See application file for complete search history.

(56) References Cited

U.S. PATENT DOCUMENTS 3,612,758 A    10/1971    Evans et al. ........... 178/5.4 R (Continued)

FOREIGN PATENT DOCUMENTS

EP    0 390 465    10/1990

(Continued)

OTHER PUBLICATIONS

Cominsky, B. et al., "An Electrophoretic Ink for All-Printed Reflective Electronic Displays", Letters to Nature, pp. 253-255 (1998).

(Continued)

*Primary Examiner*—Chris Fiorilla
*Assistant Examiner*—Sing P. Chan
(74) *Attorney, Agent, or Firm*—Howrey LLP

(57) ABSTRACT

A process for forming a patterned thin film structure on a substrate or in-mold decoration film is disclosed. A pattern is printed with a material, such as a masking coating or ink, on the substrate, the pattern being such that, in one embodiment, the desired structures will be formed in the areas where the printed material is not present, i.e., a negative image of thin film structure to be formed is printed. In another embodiment, the pattern is printed with a material that is difficult to strip from the substrate, and the desired thin film structures will be formed in the areas where the printed material is present, i.e., a positive image of the thin film structure is printed. The thin film material is deposited on the patterned substrate, and the undesired area is stripped, leaving behind the patterned thin film structure.

7 Claims, 18 Drawing Sheets

U.S. PATENT DOCUMENTS

| | | | |
|---|---|---|---|
| 3,668,106 A | 6/1972 | Ota | 204/299 |
| 3,697,679 A | 10/1972 | Hathaway | 178/6.6 A |
| 3,935,334 A | 1/1976 | Narui et al. | |
| 4,022,927 A | 5/1977 | Pfeiffer et al. | |
| 4,071,430 A | 1/1978 | Liebert | 204/299 |
| 4,078,935 A * | 3/1978 | Nakagiri et al. | 430/527 |
| 4,093,534 A | 6/1978 | Carter et al. | 350/355 |
| 4,119,483 A | 10/1978 | Hubsch et al. | |
| 4,217,182 A | 8/1980 | Cross | |
| 4,285,801 A | 8/1981 | Chiang | 204/299 R |
| 4,345,000 A | 8/1982 | Kawazoe et al. | |
| 4,368,281 A * | 1/1983 | Brummett et al. | 523/458 |
| 4,420,515 A | 12/1983 | Amon et al. | |
| 4,495,981 A | 1/1985 | Kindlmann et al. | |
| 4,586,980 A | 5/1986 | Hirai et al. | |
| 4,643,912 A | 2/1987 | Nakagawa et al. | |
| 4,655,897 A | 4/1987 | DiSanto et al. | 204/299 R |
| 4,663,192 A | 5/1987 | Hatakeyama | 427/108 |
| 4,680,103 A | 7/1987 | Beilin et al. | 204/299 R |
| 4,714,631 A * | 12/1987 | Aufderheide | 427/250 |
| 4,741,988 A | 5/1988 | Van der Zande et al. | 430/312 |
| 4,910,045 A | 3/1990 | Giesecke et al. | |
| 4,977,013 A | 12/1990 | Ritchie et al. | |
| 4,995,718 A | 2/1991 | Jachimowicz et al. | 353/31 |
| 5,102,497 A | 4/1992 | Hamaguchi et al. | 156/656 |
| 5,177,476 A | 1/1993 | DiSanto et al. | 345/107 |
| 5,276,438 A | 1/1994 | DiSanto et al. | 345/107 |
| 5,279,511 A | 1/1994 | DiSanto et al. | 445/24 |
| 5,310,778 A * | 5/1994 | Shor et al. | 524/556 |
| 5,368,902 A * | 11/1994 | Todd et al. | 427/601 |
| 5,380,362 A | 1/1995 | Schubert | 106/493 |
| 5,403,518 A | 4/1995 | Schubert | 252/572 |
| 5,436,034 A | 7/1995 | Giesecke et al. | |
| 5,460,922 A | 10/1995 | Swirbel et al. | |
| 5,495,981 A | 3/1996 | Warther | |
| 5,573,711 A | 11/1996 | Hou et al. | 252/572 |
| 5,589,100 A | 12/1996 | Grasso | 252/299.01 |
| 5,699,097 A | 12/1997 | Takayama et al. | 347/171 |
| 5,795,527 A * | 8/1998 | Nakamura et al. | 264/267 |
| 5,835,174 A | 11/1998 | Clinkeman et al. | 349/86 |
| 5,837,609 A | 11/1998 | Todd et al. | |
| 5,888,372 A | 3/1999 | Bollens et al. | |
| 5,914,806 A | 6/1999 | Gordon, II et al. | 359/296 |
| 5,930,026 A | 7/1999 | Jacobson et al. | 359/296 |
| 5,961,804 A | 10/1999 | Jacobson et al. | 204/606 |
| 5,976,405 A | 11/1999 | Clinkeman et al. | 252/299.01 |
| 6,017,584 A | 1/2000 | Albert et al. | 427/213.3 |
| 6,037,058 A | 3/2000 | Clinkeman et al. | 428/402.2 |
| 6,067,185 A | 5/2000 | Albert et al. | 359/296 |
| 6,080,606 A | 6/2000 | Gleskova et al. | 438/151 |
| 6,111,598 A | 8/2000 | Faris | 348/57 |
| 6,113,810 A | 9/2000 | Hou et al. | 252/572 |
| 6,117,300 A | 9/2000 | Carbin et al. | |
| 6,120,588 A | 9/2000 | Jacobson | 106/31.16 |
| 6,120,839 A | 9/2000 | Comiskey et al. | 427/213.3 |
| 6,131,512 A | 10/2000 | Verlinden et al. | |
| 6,140,025 A * | 10/2000 | Imai et al. | 430/325 |
| 6,172,798 B1 | 1/2001 | Albert et al. | 359/296 |
| 6,184,856 B1 | 2/2001 | Gordon, II et al. | 345/107 |
| 6,232,950 B1 | 5/2001 | Albert et al. | 345/107 |
| 6,252,624 B1 | 6/2001 | Yuasa et al. | 348/56 |
| 6,294,218 B1 | 9/2001 | Igel et al. | |
| 6,312,304 B1 | 11/2001 | Duthaler et al. | 445/24 |
| 6,327,072 B1 | 12/2001 | Comiskey et al. | 359/296 |
| 6,337,761 B1 | 1/2002 | Rogers et al. | 359/296 |
| 6,392,786 B1 | 5/2002 | Albert | 359/296 |
| 6,426,143 B1 * | 7/2002 | Voss et al. | 428/378 |
| 6,490,021 B1 | 12/2002 | Koyama | 349/139 |
| 6,507,376 B1 | 1/2003 | Nakamura | 349/38 |
| 2002/0083858 A1 * | 7/2002 | MacDiarmid et al. | 101/484 |
| 2002/0126249 A1 | 9/2002 | Liang et al. | 349/187 |
| 2002/0182544 A1 | 12/2002 | Chan-Park et al. | 430/311 |
| 2003/0038772 A1 | 2/2003 | De Boer et al. | 345/107 |

FOREIGN PATENT DOCUMENTS

| | | |
|---|---|---|
| EP | 1 089 117 A2 | 4/2001 |
| GB | 2207289 A * | 1/1989 |
| JP | 57-177029 | 10/1982 |
| JP | 59-171930 | 9/1984 |
| JP | 03 084521 | 10/1991 |
| JP | 09 254 332 | 9/1997 |
| WO | WO 99/56171 | 11/1999 |
| WO | WO 00/36465 | 6/2000 |
| WO | WO 00/60410 | 10/2000 |
| WO | WO 01/67170 | 9/2001 |
| WO | 02/01281 | 1/2002 |

OTHER PUBLICATIONS

Dalisa, A. L., "Electrophoretic Display Technology", IEEE Transactions of Electron Devices, Jul. 1997, pp. 827-834.

Drzaic, Pl, "Liquid Crystal Dispersion", The PDLC Paradigm, (1995) p. 1-9.

Harvey, T. G. "Replication Techniques for Micro-Optics", SPIE, vol. 3099, p. 76-82 (1997).

Hopper, M.A. and Novotny, V., "An Electrophoretic Display It's Properties, Model and Addressing" IEEE Transactions on Electron Devices, vol. ED-26, No. 8, Aug. 1979, pp. 1148-1152.

Harbour, J.R. et al, "Subdivided Electrophoretic Display", Xerox Disclosure Journal, vol. 4, No. 6 (1979).

Inoue, et al, "Low Temperature Poly-Si TFT—Electrophoretic Displays (TFT-EPDs) with Four Level Gray Scale", Int'l Electron Devices Meeting 2000, Technical Digest San Francisco. CA Dec. 10-13, 2000, pp. 197-200.

Lewis, J.C., et al., "Gravitational, Inter-Particle and Particle-Electrode Forces in Electrophoretic Display" Proceeding of the S.I.D., vol. 18/3&4 1977.

U.S. Appl. No. 09/518,488, filed Mar. 3, 2000, Liang et al.

U.S. Appl. No. 09/606,654, filed Jun. 28, 2000, Liang et al.

Murau, P., et al., "The Understanding and Elimination of Some Suspension Instabilities in an Electrophoretic Display", J. Appl. Phys., 49 (9), (1978).

Nakamura, E., et al., "Development of Electrophoretic Display Using Microcapsulated Suspension", SID Digest, (1998), pp. 1014-1017.

Ota, I., et al., "Electrophoretic Image Display EPID Panel", Proceedings of the IEEE, vol. 1, No. 7, Jul. 1973.

Singer, B. et al, "An X-Y Addressable Electrophoretic Display", Proceeding of the S.I.D., vol. 18/3&$, (1977).

Slafer, D.W., et al., "Continuous Manufacturing of Thin Cover Sheet Optical Media", SPIE, vol. 1663, (1992), pp. 323-335.

* cited by examiner

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

PROCESS FOR FORMING A PATTERNED THIN FILM STRUCTURE FOR IN-MOLD DECORATION

CROSS-REFERENCE TO RELATED APPLICATION

This application is a continuation-in-part of co-pending U.S. application Ser. No. 10/422,557, filed Apr. 23, 2003, the content of which is incorporated herein by reference in its entirety. Said application Ser. No. 10/422,557 claims the benefit of U.S. Provisional Application Ser. No. 60/375,902, filed Apr. 24, 2002, the content of which is incorporated herein by reference in its entirety.

FIELD OF THE INVENTION

The present invention relates generally to in-mold decoration. A process for forming a patterned thin film on a substrate for in-mold decoration is disclosed.

BACKGROUND OF THE INVENTION

In-mold decoration (IMD) has emerged as an increasingly popular set of techniques for decorating injection-molded parts. IMD techniques are used to incorporate text, numbers, legends, other symbols and information, and purely decoratively designs into injection molded parts such as telephones and other consumer electronics, automobile dashboards, containers and packaging for consumer products, and indeed the full spectrum of injection molded parts.

IMD typically involves creating an in-mold decoration film (IMD film or IMD decorated film) comprising the image to be transferred to or integrated with a surface of the injection-molded part. In a typical in-mold transfer process, a polyethylene terephthalate (PET) film is treated with a release agent (to facilitate image transfer) and then coated with a durable layer to provide oil and scratch resistance. The decoration is then printed and/or otherwise formed on the treated and coated PET film, followed by coating the film with an adhesive (e.g., hot melt or polyurethane adhesive) to form the in-mold transfer film. The film is then inserted into the injection mold prior to injection of the molten resin, and the decoration (or other image) is transferred from the PET film to the injection-molded item. In a typical in-mold insert process, the decoration or other image is not transferred from the IMD decorated film to the injection-molded item but instead the IMD decorated film is bonded to and becomes a part of the injection-molded item. In one typical in-mold insert process, a polycarbonate (PC) substrate is used. The decoration or other image to be included on the injection-molded item is printed or otherwise formed on a surface of the PC substrate. The patterned substrate is then coated with a thin protective layer (to protect the ink from damage during the injection process) to provide the IMD decorated film.

In some cases, IMD techniques may be used to apply or incorporate into an injection-molded item a decoration or other image that comprises a patterned metal thin film or other thin film material. In one approach, such a patterned thin film design is incorporated by forming a patterned metal thin film layer on the IMD decorated film. One typical prior art approach to fabricating an in-mold decoration film comprising a patterned metal thin film involves the use of photolithographic techniques and chemical etching. The typical photolithographic process comprises several time consuming and high cost steps including (1) forming an unpatterned metal thin film layer (2) coating the metal thin film with photoresist; (3) patterning the photoresist by image-wise exposing it through a photomask to, for example, ultraviolet light; (4) "developing" the patterned image by removing the photoresist from either the exposed or the unexposed areas, depending on the type of photoresist used, to uncover the metal thin film in areas from which it is to be removed (i.e., areas where no thin film material is to be located); (5) using a chemical etching process to remove the thin film from the areas from which the photoresist has been removed; and (6) stripping the remaining photoresist to uncover the patterned thin film structures.

Certain of the processing steps under the photolithographic approach, such as the image-wise exposure, are time consuming and require careful registration and alignment of the mask and the moving target area. In addition, development and stripping of photoresist and treatment of waste from the chemical etching process may be time consuming and expensive, in addition to potentially posing an environmental hazard. The chemical etching process also tends to result in a less shiny metal surface, which is often undesirable for high-end decoration applications.

Therefore, there is a need for a process for forming patterned thin film structures on a plastic substrate for use as an IMD decorated film that does not require the use of photolithography or chemical etching.

BRIEF DESCRIPTION OF THE DRAWINGS

The present invention will be readily understood by the following detailed description in conjunction with the accompanying drawings, wherein like reference numerals designate like structural elements, and in which:

FIGS. 5A-1 through 5D-2 illustrate an alternative process used in one embodiment to form a patterned thin film on a substrate.

FIGS. 6A-1 through 6F-2 illustrate a further alternative to the process shown in FIGS. 1–4.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A process for forming a patterned thin film structure on a substrate is disclosed. In one embodiment, the thin film material may be conductive, non-conductive, or semi-conductive. In one embodiment, the patterned thin film structure comprises a metallic or metal-based design formed on a polymer substrate for use as an IMD decorated film. A pattern is printed with a masking coating or an ink, on the substrate, the pattern being such that, in one embodiment, the desired thin film structures will be formed in the areas where the printed masking coating is not present, i.e., a negative image of thin film structure to be formed is printed. The masking layer comprises 5–80% by weight, preferably 10–60% by weight based on dried weight of the masking layer, of re-dispersible particulates uniformly dispersed in a binder that is soluble or dispersible in the stripper composition used in the subsequent stripping process. A re-dispersible particulate is defined as a particulate that is dispersible in the stripping solution used to remove the masking coating/ink. A particulate that is not re-dispersible tends to result in undesirable scum or dirty background after stripping. A thin film is deposited uniformly by, for example, vapor deposition or sputtering, onto the substrate preprinted with the masking ink. The thin film on the masking coating as well as the masking coating are then removed in the subsequent stripping step.

In another embodiment, a masking layer is first uniformly coated on the substrate and a tie or anchoring material that is difficult to strip from the substrate, is printed in a pattern onto the masking layer. The tie coat has a good adhesion to both the masking layer and the thin film to be deposited on the patterned substrate. The thin film material not deposited on the tie coat is then selectively stripped, leaving behind the patterned thin film design. In this case, the desired thin film structure is formed in the areas where the printed tie material is present, i.e., a positive image of the thin film structure is printed.

Figure 1:
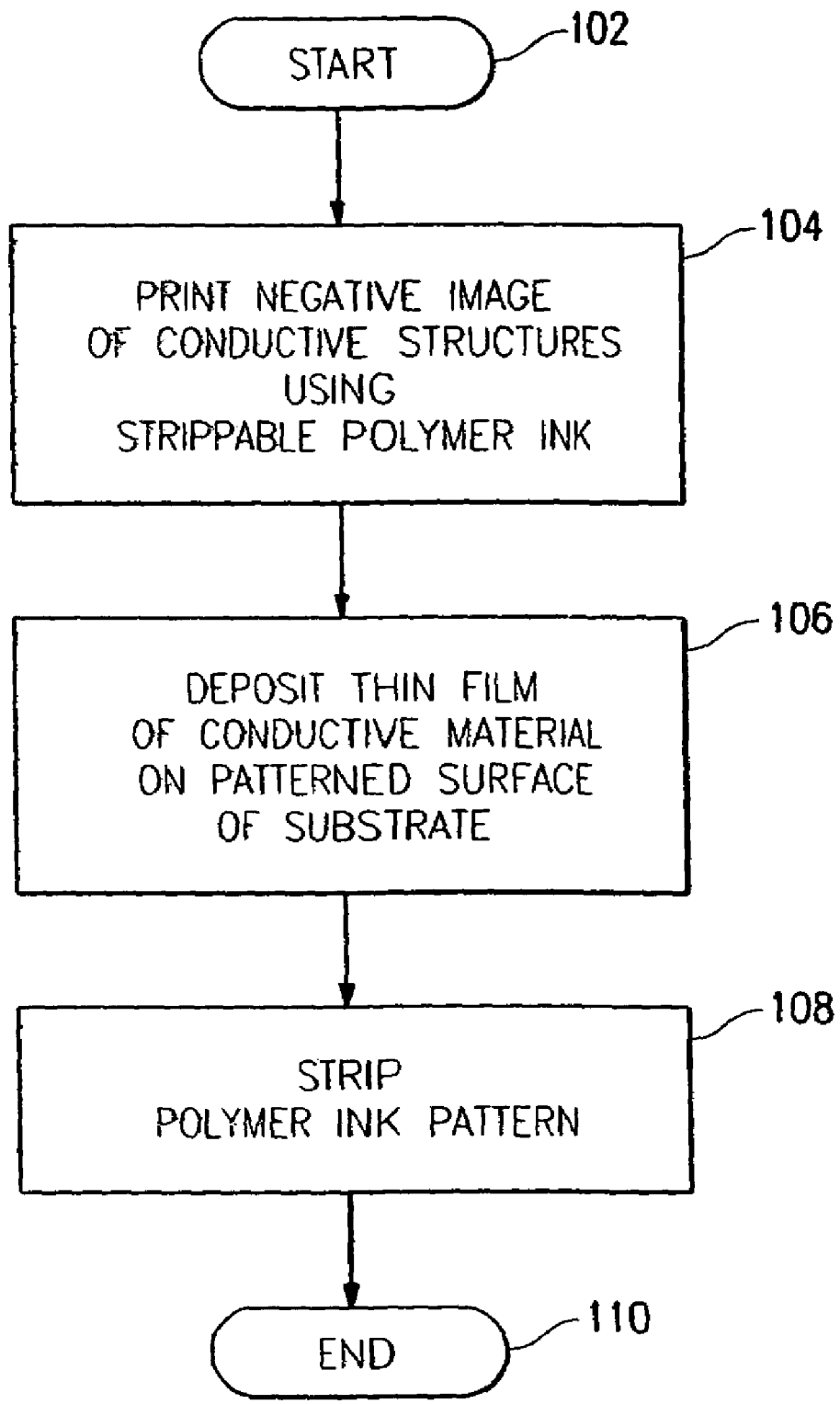
FIG. 1 is a flowchart illustrating a process used in one embodiment to form a patterned thin film on a substrate.

FIG. 1 is a flowchart illustrating a process used in one embodiment to form a patterned thin film structure on a substrate. The process begins in step 102 and proceeds to step 104 in which a negative image of the thin film structures to be formed is printed on the surface of the substrate using a masking coating or ink. In one embodiment, the masking coating or ink may be stripped using an aqueous solution and/or another common solvent. In step 104, a negative image of the thin film structures to be formed is printed in the sense that the masking coating or ink will cover areas of the substrate where the thin film material will not be present upon completion of the process and will not cover areas of the substrate where the thin film material will be present. In essence, the ink pattern serves as a mask for the subsequent deposition of thin film material, as described more fully below in connection with step 106.

Any suitable printing techniques, such as flexographic, driographic, electro photographic, and lithographic printing, may be used to print the ink pattern on the substrate. In certain applications, other printing techniques, such as stamping, screen printing, gravure printing, ink jet, and thermal printing may be suitable, depending on the resolution required. In addition, the masking coating or ink does not need to be optically contrasted with the substrate, and can be colorless.

In one embodiment, the masking coating or ink comprises a re-dispersible particulate. In one embodiment, the masking coating or ink comprises 5–80% by weight, preferably 10–60% by weight based on dried weight of the masking layer, of a re-dispersible particulate and a binder soluble or dispersible in the stripper composition. In one embodiment, the masking coating or ink comprises a water-soluble or water-dispersible polymer as a binder. Typical examples of water soluble polymers include, but are not limited to, polyvinyl alcohol, polyvinylpyrrolidone, polyvinyl pyridine, polyacrylic acid, polymethacrylic acid, polyacrylamide, polyethylene glycol, poly(ethylene-co-maleic anhydride), poly (vinyl ether-co-maleic anhydride), poly(styrene-co-maleic anhydride), poly(butyelene-co-itaconic acid), PEOX, polystyrene sulfonate, cellulose derivatives such as hydroxyethyl cellulose, hydroxypropyl cellulose, methyl cellulose, carboxymethyl cellulose, xanthan gum, gum Arabic, gelatin, lecitin, and their copolymers. In one such embodiment, the water-dispersible polymer comprises a water- or alkaline-dispersible wax, polyolefin, or acrylic latexes or dispersions. In one embodiment, the masking coating or ink comprises a solvent-soluble or solvent-dispersible polymer as a binder. In one embodiment, the masking coating or ink comprises a re-dispersible particulate derived from silica, $CaCO_3$, $CaSO_4$, $BaSO_4$, $Al_2O_3$, $TiO_2$, hollow-spheres, non-film-forming latexes or dispersions, inorganic pigment(s), or organic pigment(s). In one embodiment, the masking coating or ink comprises a re-dispersible particulate comprising a polymeric or polymeric composite particle. In one embodiment, including a re-dispersible particulate in the masking coating or ink facilitates subsequent stripping of the masking coating or ink. In one embodiment, including a re-dispersible particulate in the masking coating or ink facilitates subsequent stripping of the masking coating or ink by reducing the thickness or integrity of the masking coating or ink layer and/or improving the permeation of a stripping solvent into the masking coating or ink layer during stripping.

In step 106, a thin film of material is deposited on the patterned surface of the substrate. In one embodiment, the thin film material may be conductive, non-conductive, or semi-conductive. In one embodiment, vapor deposition is used to deposit the thin film of material on the patterned side of the substrate in step 106. In such an embodiment, aluminum, copper, or any material suitable for being deposited as a thin film through vapor deposition or spraying may be used as the thin film material. In one alternative embodiment, the thin film material is deposited by sputter coating the patterned side of the substrate with the thin film material. In such an embodiment, indium tin oxide (ITO), zinc sulfide, gold, silver, copper, iron, nickel, zinc, indium, chromium, aluminum-doped zinc oxide, gadolinium indium oxide, tin oxide, or fluorine-doped indium oxide, or any other material suitable for being deposited in a thin film through sputter coating may be used.

Any process for forming a thin film layer on the patterned substrate may be used, including without limitation by laminating, electroplating, sputtering, vacuum deposition, or combinations of more than one process for forming a thin film onto a plastic substrate. Useful thin film conductors include metal conductors such as, for example, aluminum, copper, zinc, tin, molybdenum, nickel, chromium, silver, gold, iron, indium, thallium, titanium, tantalum, tungsten, rhodium, palladium, platinum and/or cobalt, etc., and metal oxide conductors such as indium tin oxide (ITO) and indium zinc oxide (IZO), as well as alloys or multilayer composite films derived from the aforementioned metals and/or metal oxides. Further, the thin film structures described herein may comprise either a single layer thin film or a multi-layer thin film. Useful plastic substrates include epoxy resins, polyimide, polysulfone, polyarylether, polycarbonate (PC), polyethylene terephthalate (PET), polyethylene terenaphthalate (PEN), poly(cyclic olefin), and their composites. For in-mold decoration, the substrate is typically coated with a release layer (not shown), which is subsequently overcoated with a durable layer (not shown). A pattern of masking coating is printed onto the durable layer. The printed multilayer film is then overcoated by, for example, vapor deposition or sputtering, with a thin film.

In step 108 of the process shown in FIG. 1, the masking coating or ink is stripped from the patterned surface of the substrate on which the thin film material has been deposited in step 106. The stripping of the coating/ink in step 108 has the effect of stripping away the printed pattern formed in step 104 as well as the portion of the thin film material deposited in step 106 that was deposited on to the areas of the substrate where the coating/ink was present. As a result, the stripping solvent is able to strip away the coating/ink pattern and the thin film material formed on the top surface of the coating/ink pattern, even though the stripping step is performed after the deposition of the thin film in step 106. The process shown in FIG. 1 then ends in step 110. Without limiting the generality of the present disclosure, it is believed that in certain embodiments at least part of the masking coating/ink printed in step 104 is exposed, or nearly so, to the stripping solvent, despite the masking patterns having been covered with metal thin film as a result of the deposition process of step 106. In one embodiment, the masking coating or ink comprises 5–80% by weight, preferably 10–60% by weight based on dried weight of the masking layer, of a re-dispersible particulate and a binder soluble or dispersible in the stripper composition. The presence of the re-dispersible particulates dramatically improves the stripability of the thin film on the masking coating as well as the blocking resistance of the masking coated films, particularly at high temperature and humidity conditions.

In one embodiment, low molecular weight additives such as plasticizers, surfactants, and residual monomers or solvents in the masking coating/ink may cause defects or micro-porosity in the metal coated on the ink, accelerating exposure of the masking coating to the solvent. The present disclosure contemplates that any suitable combination of coating/ink, thin film, and stripping process may be used, without limiting the applicability of the present disclosure in any way, and without limiting the present disclosure to any particular stripping mechanism or theory. With respect to the process shown in FIG. 1, the only requirement is that the combination used be such that upon stripping the areas of thin film formed on the substrate remain present and the areas of thin film formed on the strippable masking coating/ink be stripped away, or largely so, such that after stripping the thin film structures are not present in areas where the coating/ink pattern was present, or sufficiently nearly so for the desired design to be portrayed adequately.

The process described above does not require the use of photolithography and selective etching of the conductive layer to define patterned thin film structures on a substrate. Instead, the ink pattern is used to define, prior to the deposition of the thin film material, the shape of the thin film structures to be formed. Depending on the durable layer used in the in-mold decoration film, a simple solvent, such as water, aqueous solutions, alcohols, ketones, esters, DMSO, or many other common organic solvents or solvent mixture, may be used to strip away the ink and the thin film material formed on top of the ink pattern. An aqueous stripper is preferred because of the environmental issues. The patterned thin film structures may be formed via a roll-to-roll process that is not as time consuming, not as expensive, and does not generate as much toxic chemical waste as the photolithographic and chemical etching techniques used in prior art photolithographic processes.

Figure 2A:
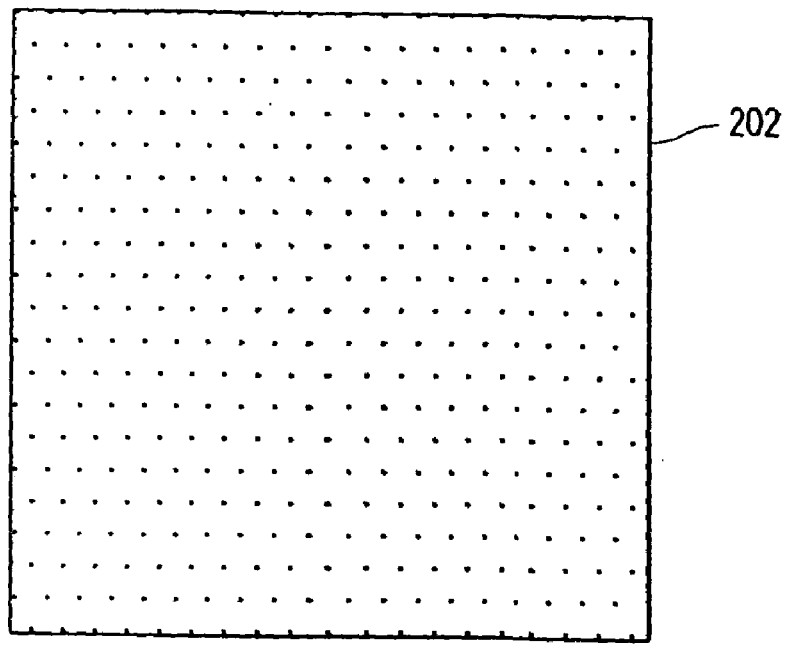
FIGS. 2A through 2D illustrate a schematic plan view of a series of processing steps used to form four metal stripes on a substrate.
Figure 2B:
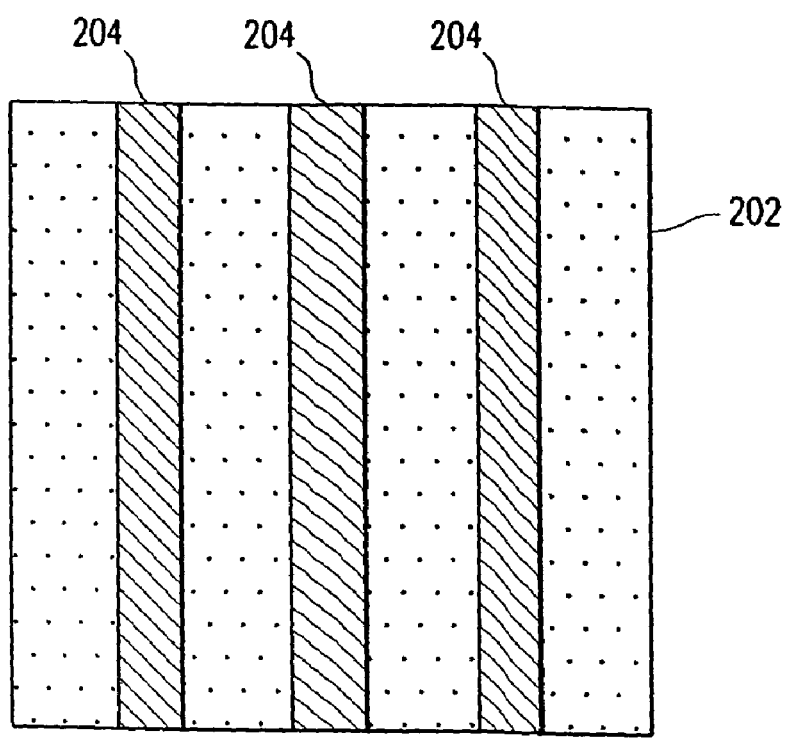

As noted above, the techniques described herein may be used in one embodiment to create an IMD decorated film comprising a patterned metallization or other patterned thin film layer. FIGS. 2A through 2D illustrate a schematic plan view of a series of processing steps used to form on a substrate using thin film structures a simple design comprising four vertical lines. FIG. 2A shows a plastic substrate 202. In FIG. 2B an ink pattern comprising lines 204 has been printed on the substrate 202. In the example shown in FIG. 2B the lines 204 define on the substrate 202 areas on which four vertical thin film structures will be formed, as described more fully below, in the areas of substrate 202 that are not covered by the lines 204.

Figure 2C:
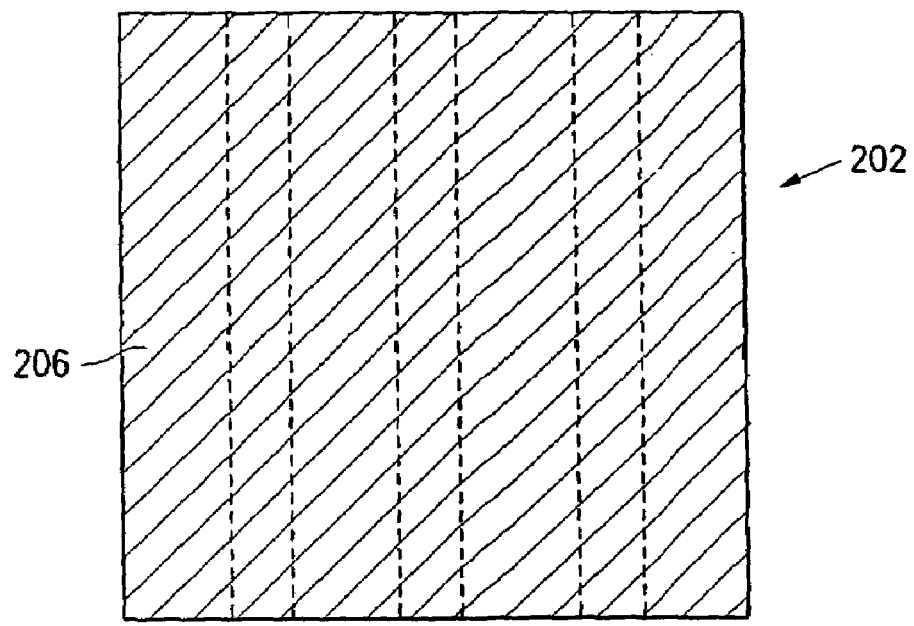
Figure 2D:
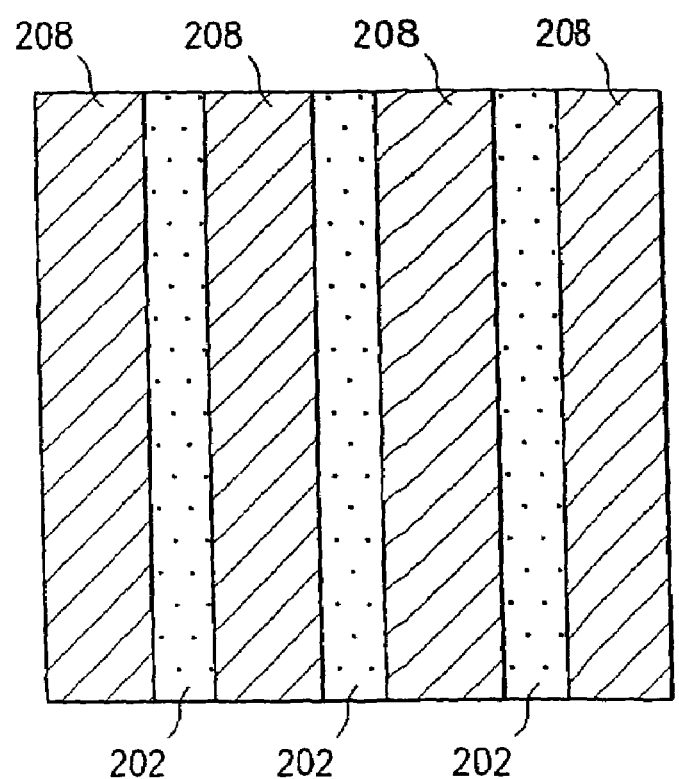

In FIG. 2C, a thin film layer 206 has been formed on the patterned surface of the substrate, covering both the portions of the substrate 202 that are not covered by the ink lines 204 (shown by dashed lines in FIG. 2C) and the portions that are covered by the ink lines 204. In FIG. 2D, the ink pattern has been stripped away, along with the portions of the thin film 206 that were deposited on the ink lines 204, exposing thin film structures 208. The respective thin film structures 208 are separated from each other by the areas of the substrate 202 exposed by the stripping away of the ink lines 204.

Figure 3A:
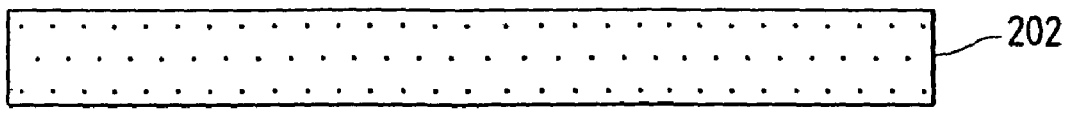
FIGS. 3A through 3D further illustrate the example shown in FIGS. 2A through 2D by providing a schematic front cross-sectional view of the processing steps shown in FIGS. 2A through 2D.
Figure 3B:
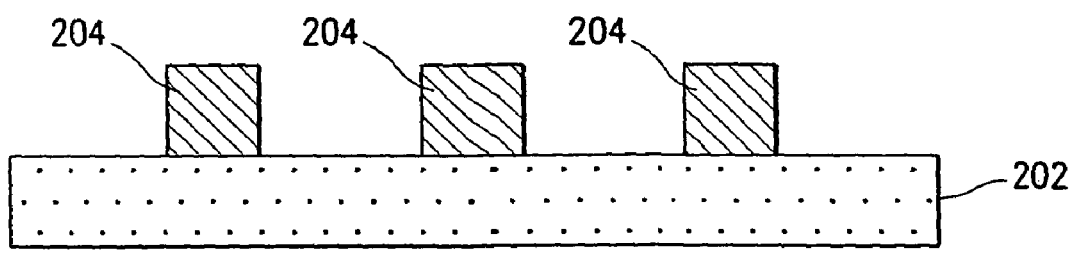
Figure 3C:
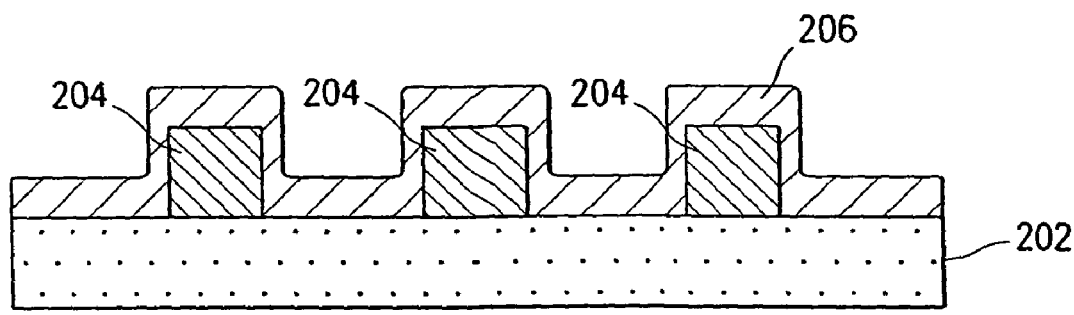
Figure 3D:
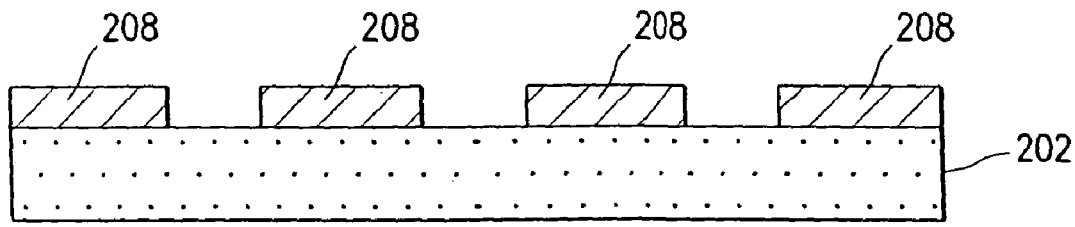

FIGS. 3A through 3D further illustrate the example shown in FIGS. 2A through 2D by providing a schematic front cross-sectional view of the processing steps shown in FIGS. 2A through 2D. FIG. 3A shows a front cross-sectional view of the substrate 202. FIG. 3B shows the ink lines 204 formed on the substrate 202. As shown in FIG. 3C, the thin film layer 206 forms on the portions of the substrate not covered by the lines 204 and on the top and side surfaces of the polymer ink lines 204. Finally, FIG. 3D shows the thin film structures 208 that remain formed on the substrate 202 subsequent to the stripping of the lines 204, which has the effect of stripping away both the ink lines 204 and any thin film material 206 formed on top of the ink lines 204.

Figure 4A:
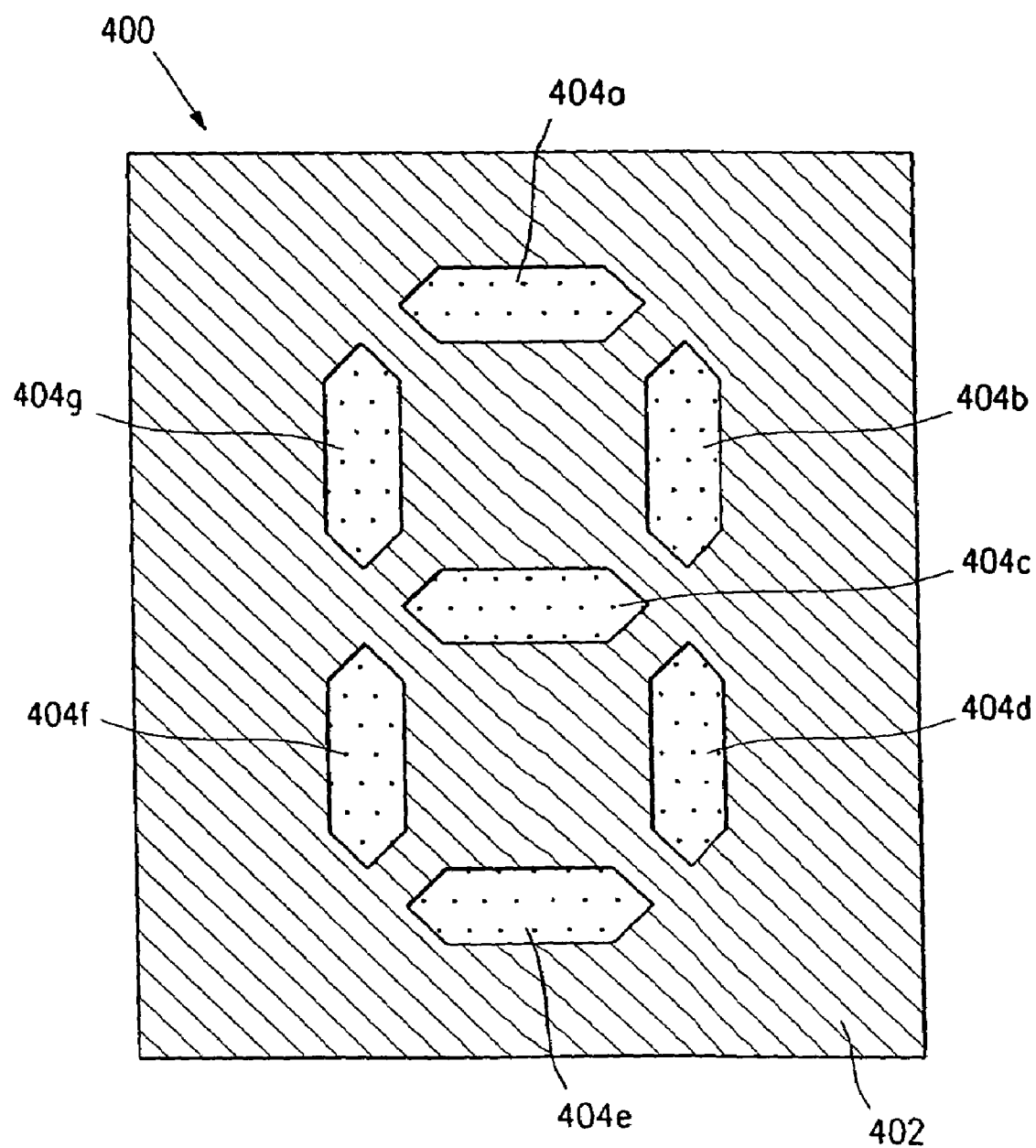
FIGS. 4A and 4B illustrate a schematic plan view of an example in which segment electrodes for a seven segment pattern are formed using an embodiment of the process described herein.
Figure 4B:
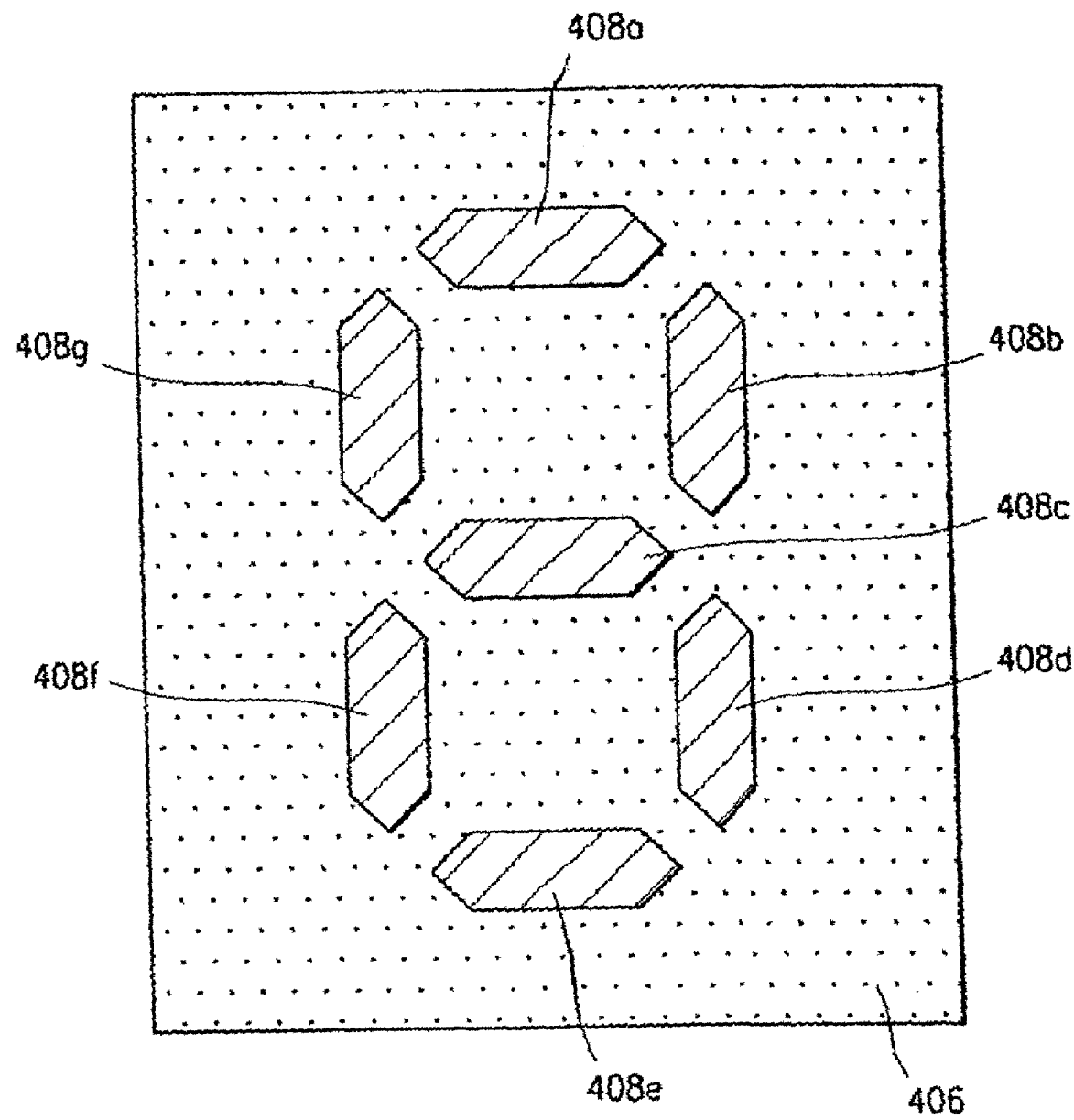

While FIGS. 2A–2D and 3A–3D illustrate an example in which four vertical thin film structures are formed on a plastic substrate, the coating/ink may be printed in any arbitrary pattern to define on the substrate thin film structures of any desired shape or size. FIGS. 4A and 4B illustrate a schematic plan view of an example in which segments forming the number "8" are formed using an embodiment of the process described herein. FIG. 4A shows the IMD decorated film 400 comprising a masking ink pattern 402 defining on a plastic substrate seven thin film segment areas 404a–404g in which the ink pattern 402 is not present such that the underlying substrate is exposed. FIG. 4B shows the same film 400 subsequent to the steps of deposition of the thin film and stripping of the ink pattern. As shown in FIG. 4B, the stripping away of the ink exposes a background area 406 of the substrate on which no thin film structure is present. In addition, thin film segments 408a–408g have been formed and remain in the segment areas 404a–404g defined as described above in connection with FIG. 4A.

As is apparent from the above discussion, thin film structures of any shape or size may be formed simply by defining through use of the printed pattern areas on the substrate on which thin film structures are to be formed.

In one embodiment of the process illustrated in FIGS. 1–4, the coating/ink used to pattern the substrate comprises Sun Chemical Aquabond AP blue ink and/or Sunester red ink (Sun Chemical, Northlake, Ill.) and the substrate comprises 5 mil thick Melinex 453 polyester (DuPont Teijin, Hopewell, Va.). The ink may be applied through a stencil using a hand proofer with a #360 anilox roller. The ink may be dried with a heat gun. The metal thin film is deposited by loading the patterned substrate into a DC-magnetron sputtering system to deposit ITO film up to about 100 nm thickness. The patterned substrate may be plasma treated prior to deposition of the metal thin film. The ink pattern and metal thin film formed thereon is stripped by spraying the patterned substrate on which the metal thin film has been formed with acetone (Histological grade, Fisher Scientific) for 1 to 2 minutes at room temperature. The above processing steps result in the metal thin film (i.e., ITO) formed in the ink pattern being removed along with the ink, leaving an area on the substrate where no ITO coating is present such that no measurable conductivity in present in such areas where the ITO has been removed.

In one embodiment of the processes illustrated in FIGS. 1–4, Film III Warm Red ink (Environmental Inks and Coatings, Los Angeles, Calif.) is applied using a hand proofer to define a pattern or mask on a substrate comprising 5 mil thick Melinex ST505 polyester (DuPont Teijin, Hopewell, Va.). The metal thin film is deposited by loading the patterned substrate into a DC-magnetron sputtering system to deposit ITO film up to about 100 nm thickness. The ink is washed from the ITO coated patterned substrate by spraying with acetone (Histological grade, Fisher Scientific) for 30 to 60 sec. The ITO formed on the ink is removed along with the ink, leaving an area where there is no ITO coating where the ink pattern was printed.

In one embodiment of the processes illustrated in FIGS. 1–4, the masking ink pattern is printed on 5 mil thick, 4507 Polyester (Transilwrap, Franklin Park, Ill.) using GP-217 Process Magenta ink (Ink Systems Inc., Commerce, Calif.) on an offset press. The inked polyester is loaded in a vacuum system for aluminum evaporation at the film thickness of 120 nm. The aluminum-coated polyester is immersed in hot (T=about 80° C.) methyl ethyl ketone (Certified grade, Fisher Scientific, MEK) for 15 seconds, and then wiped gently with a cotton swab soaked in MEK. This process strips the inked area from the polyester, along with the aluminum on top of the ink. The stripping results in a negative image from the ink, i.e., there is no aluminum coating in the areas where the ink pattern was printed, with the remaining areas (i.e., where the ink pattern was not present) being coated with aluminum.

In one embodiment of the processes illustrated in FIGS. 1–4, a masking ink pattern is made on a roll of 5 mil thick, 12" wide Melinex 453 polyester (Plastics Suppliers, Fullerton Calif.) using Film III Warm Red ink (Environmental Inks and Coatings, Los Angeles, Calif.) on a Mark Andy 4200 flexographic press. The patterned polyester is loaded into a DC-magnetron sputtering system to deposit ITO film for about 100 nm. Prior to the deposition, the ink-coated sheets may be plasma treated. The ITO coated polyester is then immersed in a jar of hot (T=about 80° C.) MEK and cleaned ultrasonically using a Fisher Scientific FS220H ultrasonic cleaner for 2 minutes. As a result of the ultrasonic cleaning step, the ink is stripped from the polyester, along with the ITO formed on top of the ink.

The ability to strip away the masking coating/ink lines after deposition of the metal thin film using a simple stripping process that is not destructive of the thin film formed in the areas where the coating/ink pattern is not present (such as but not limited to the solvent and physical peeling processes described above) facilitates a continuous fabrication process, such as a roll to roll fabrication process, because no time consuming batch processes such as imagewise exposure and development of photoresist, etching away portions of a thin film layer not covered by photoresist, or using solvents requiring special handling or conditions to remove a photoresist layer after etching, are required. By saving time and using less expensive materials, the process described herein is much less costly than other processes typically used to form on a polymer substrate the types of structures described herein. The presence of a redispersible particulate in the masking coating/ink significantly improves the blocking resistance of the coated film and in turn widens the process window of the roll-to-roll process. Moreover, the redispersible particulate greatly improves the strip-ability of the thin film deposited on the masking coating/ink.

FIGS. 5A-1 through 5D-2 illustrate an alternative process used in one embodiment to form a patterned thin film design on a substrate. The alternative process shown in FIGS. 5A-1 through 5D-2 employs a "positive" printed image in the sense that the coating/ink is printed in the pattern of the thin film structure(s) to be formed, instead of being used as described above in connection with FIGS. 1–4 to define areas where the thin film structure(s) is/are not to be formed. The process illustrated in FIGS. 5A-1 through 5D-2 is similar to that shown in FIGS. 1–4 in that the process shown in FIGS. 5A-1 through 5D-2 employs printing techniques to define the thin film structure(s) to be formed. The process shown in FIGS. 5A-1 through 5D-2 differs from the process shown in FIGS. 1–4, however, in that the printed pattern is not stripped off the substrate, as described more fully below.

Figures 1, 5A:
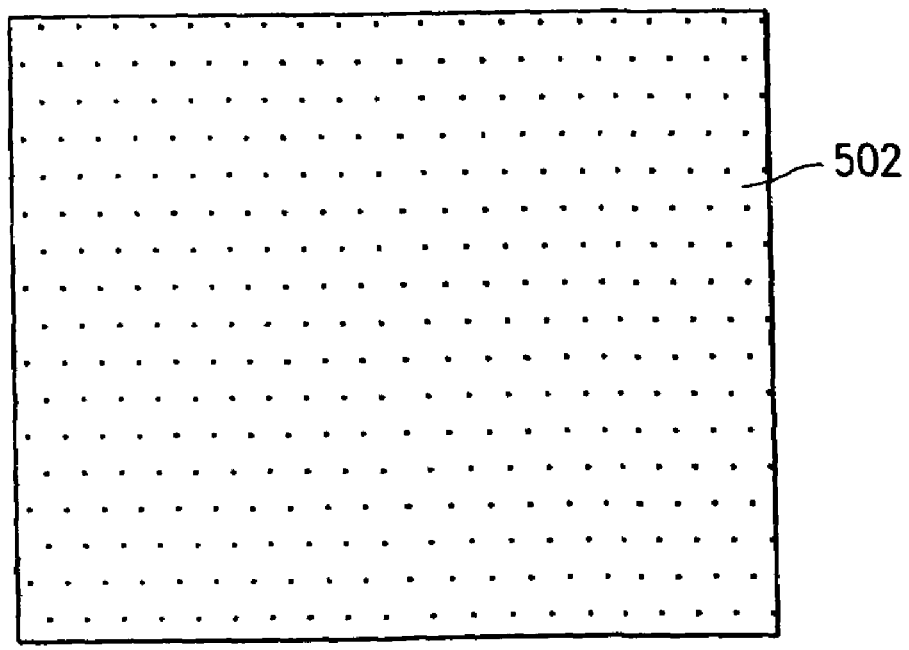
Figures 2, 5A:
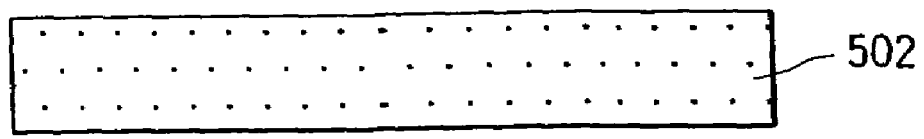
Figures 1, 5B:
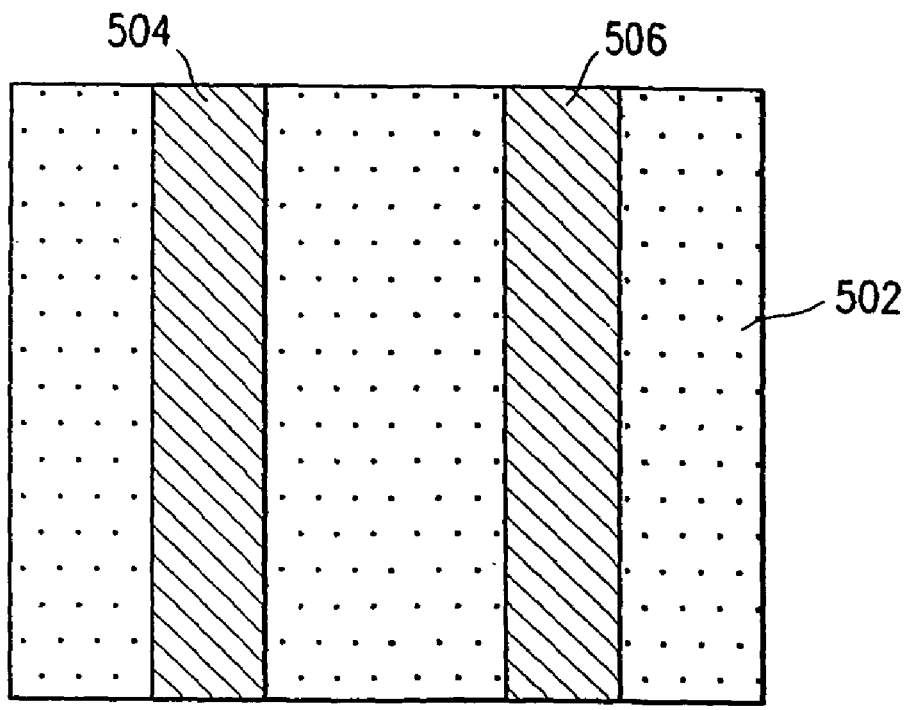
Figures 2, 5B:
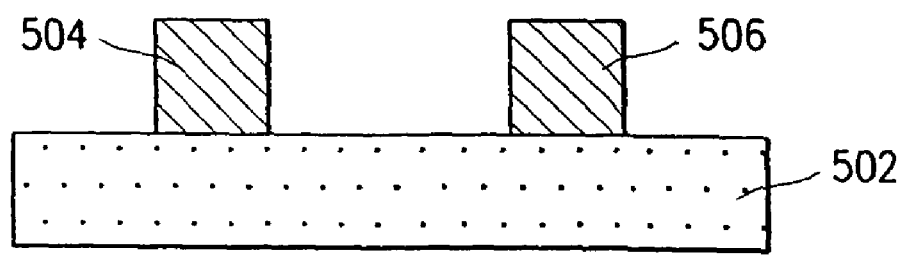

As shown in FIGS. 5A-1 and 5A-2, the thin film structures are formed on a substrate 502. The substrate 502 may be any of the substrate materials described above for use in the process illustrated by FIGS. 1–4. In one embodiment, the substrate comprises 5 mil thick, 4507 Polyester (available from Transilwrap, Franklin Park, Ill.). FIGS. 5B-1 and 5B-2 show pattern lines 504 and 506 printed on the substrate 502. In one embodiment, the pattern lines 504 and 506 are printed on the substrate 502 using GP20011 UV Process Magenta ink (Ink Systems Inc., Commerce, Calif.) on an offset press. Any ink or other printable material may be used that has the characteristic that the subsequently deposited thin film adheres to the printed material more strongly than it adheres to the substrate, as explained more fully below.

Figures 1, 5C:
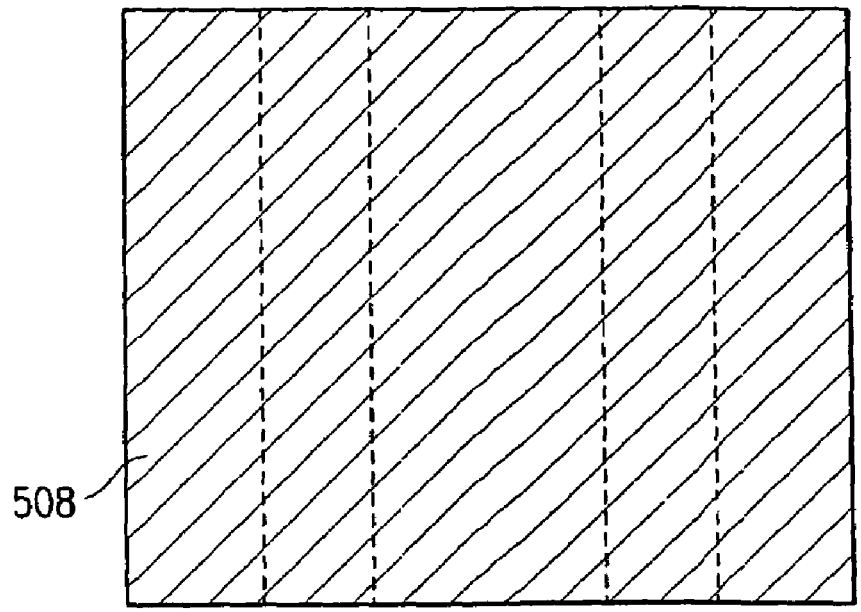
Figures 2, 5C:
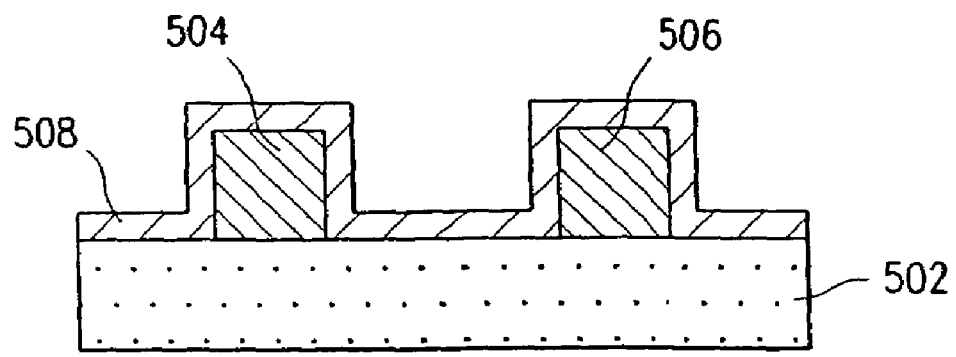

FIGS. 5C-1 and 5C-2 show a thin film layer 508 being formed on the patterned surface of the substrate, covering both the printed pattern (lines 504 and 506) and the areas of the substrate 502 not covered by the printed pattern. In one embodiment, the thin film 508 is formed by loading the patterned substrate into a vacuum system for aluminum evaporation at a film thickness of 120 nm.

Figures 1, 5D:
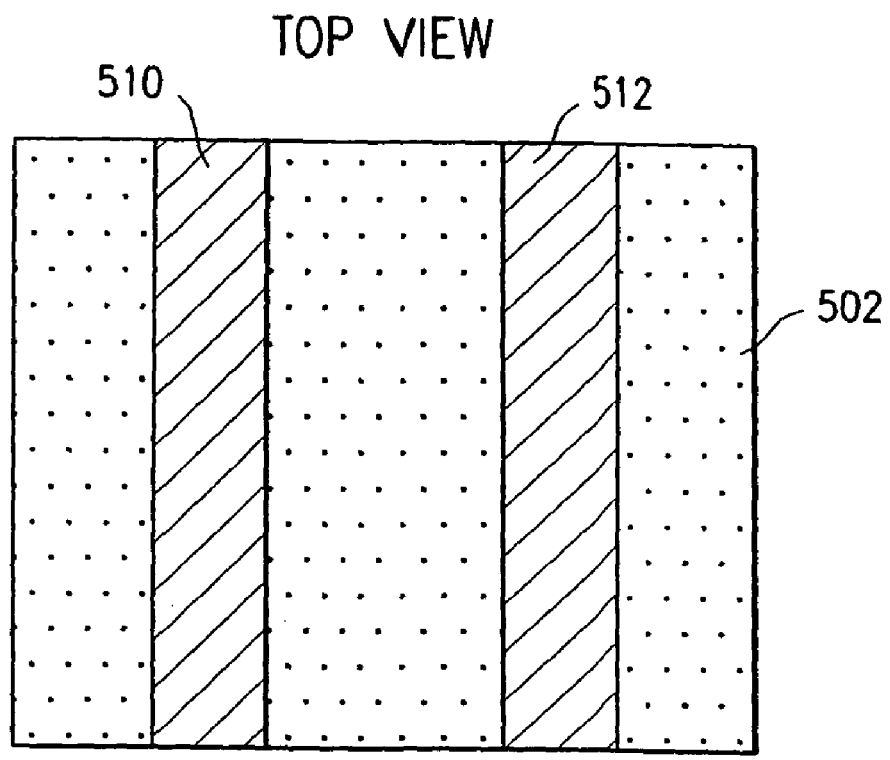
Figures 2, 5D:
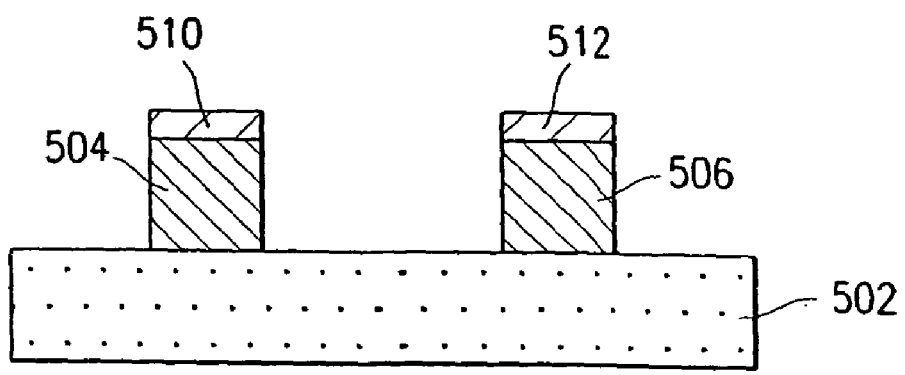

FIGS. 5D-1 and 5D-2 show the remaining structures after the portions of the thin film 508 formed on the substrate 502 have been removed by a stripping process. Thin film structures 510 and 512 remain formed on printed lines 504 and 506, respectively. In one embodiment, a solvent is used to remove the portions of the thin film formed directly on the substrate, but not the portions of the thin film formed over the printed material, leaving thin film structures in the same pattern as the printed material. In one embodiment, not shown in FIGS. 5D-1 and 5D-2, some or all of the thin film formed on the side surfaces of the printed material remains adhered to the side surfaces of the printed material after the stripping process. In one embodiment, not all of the thin film formed directly on the substrate is removed by the stripping process, but the thin film formed directly on the substrate is removed sufficiently to cause there to be little or no thin film material visible in the areas of the substrate where the printed material was not printed.

The alternative process shown in FIGS. 5A-1 through 5D-2 requires that the adhesion of the thin film layer to the substrate be low, the adhesion of the thin film layer to the printed material be high, the adhesion of the printed material to the substrate be high, and that the solvent be such that it removes the portions of the thin film layer that are formed directly on the substrate but not those portions of the thin film layer formed on the printed material.

In another alternative but preferred process, a semi-finished IMD film comprising a substrate, a release layer, and a durable layer with a poor affinity toward the thin film may be used. In one such embodiment, a surface treatment, tie coating or primer coating such as a UV curable polymer layer, having good adhesion to both the durable layer and the thin film may be used. In this case, the thin film on the uncoated areas will be removed in the stripping process to reveal the design on the top of the surface treatment or primer coating. This alternative process is similar to that shown in FIGS. 5A-1 through 5D-2, with the tie or primer coating (not shown) comprising the printed material, such as pattern lines 504 and 506. If the durable layer shows a high affinity toward the thin film, a masking coating/ink may be coated uniformly onto the durable layer before the tie coat and the printed material. The thin film on the area without the printed material will be removed in the stripping process to reveal the design on the top of the printed material and the tie coat.

Figures 1, 6A:
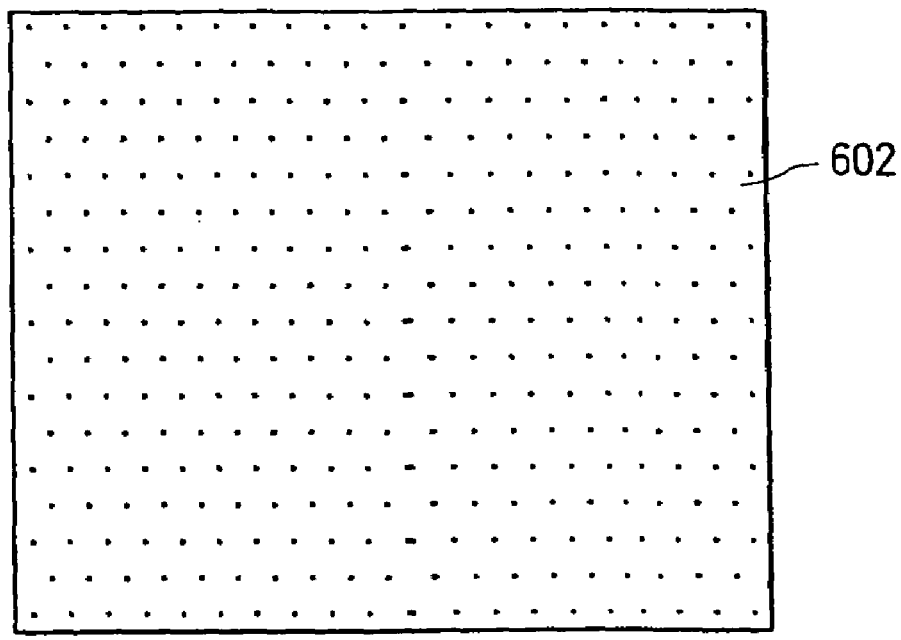
Figures 2, 6A:
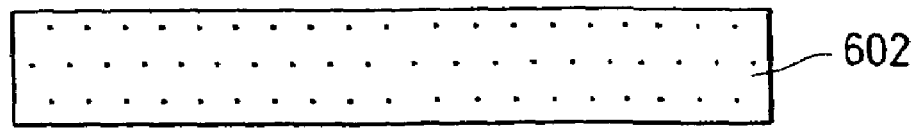
Figures 1, 6B:
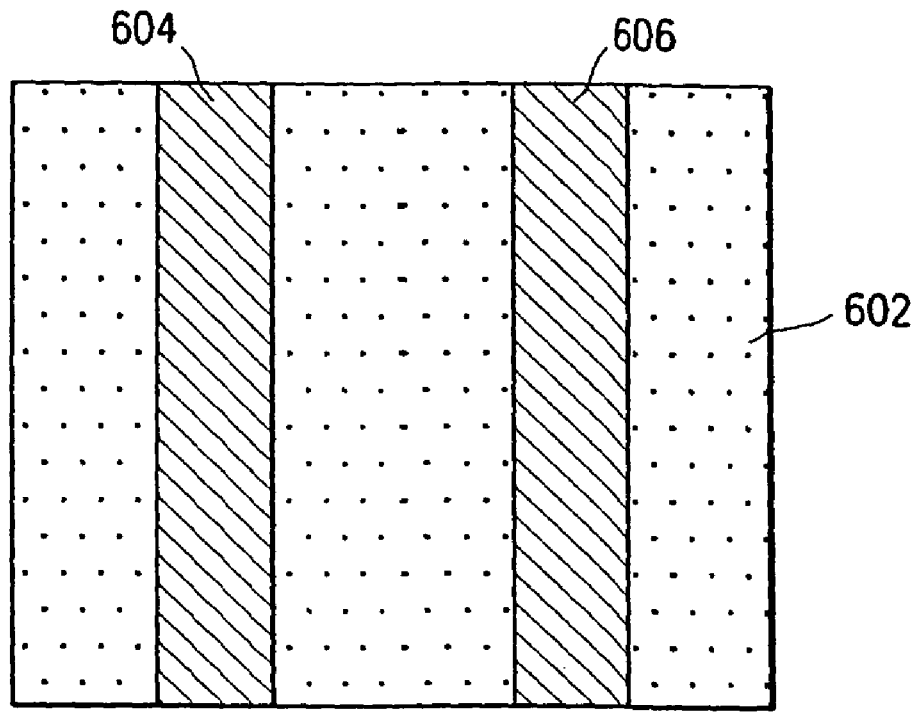
Figures 2, 6B:
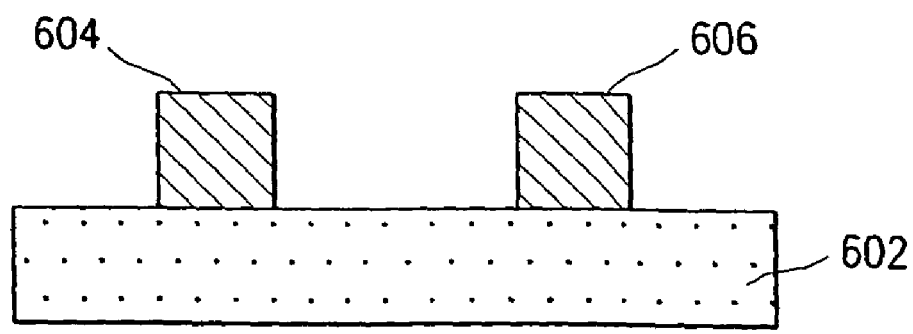
Figures 1, 6C:
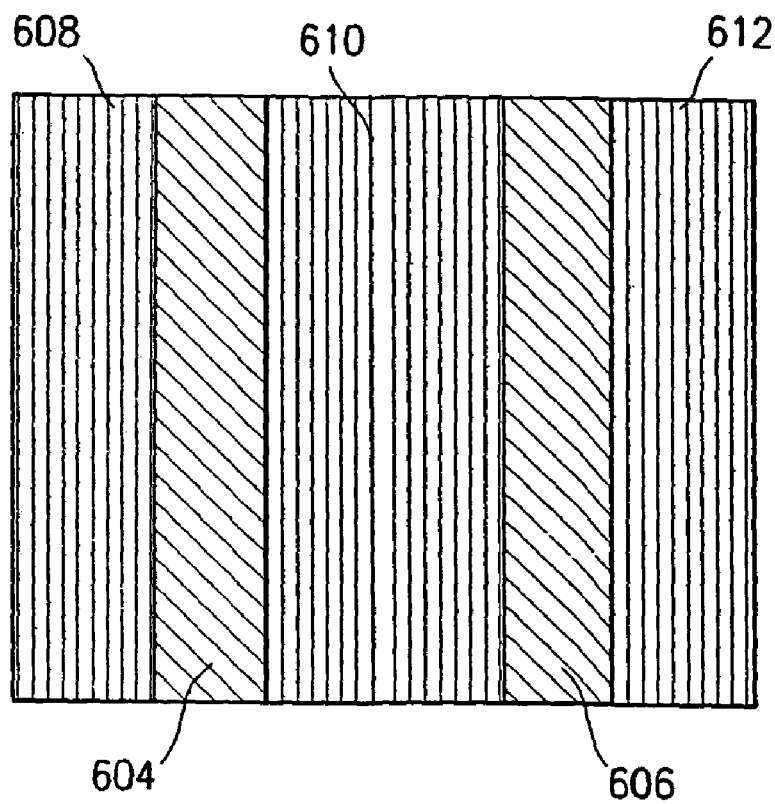
Figures 2, 6C:
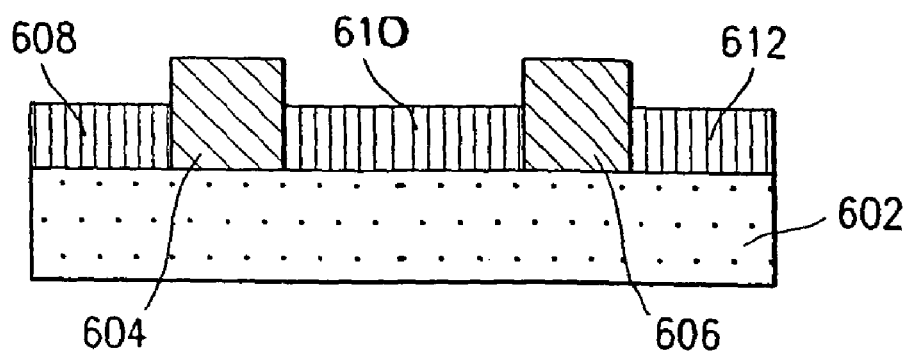
Figures 1, 6D:
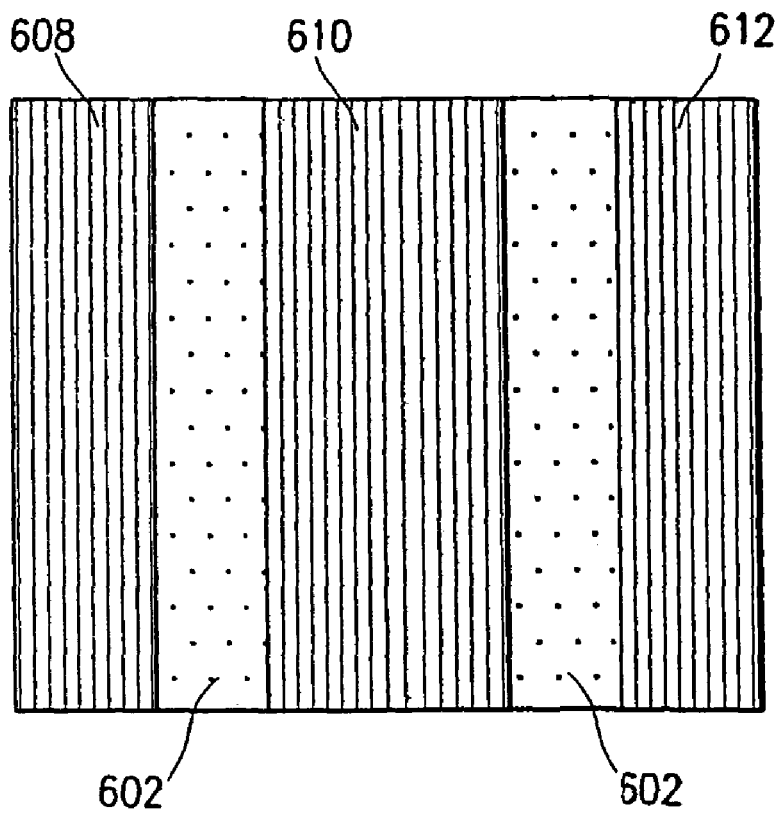
Figures 2, 6D:
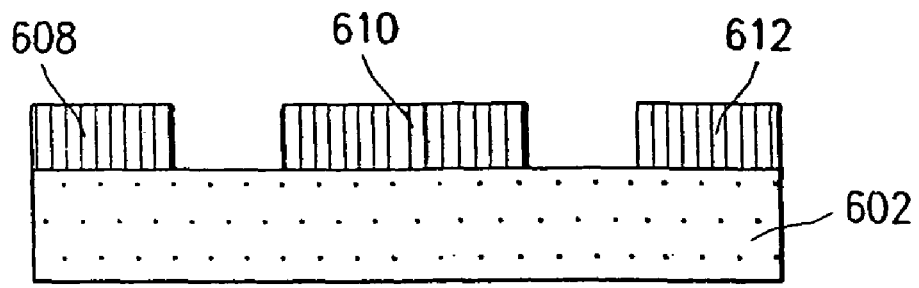
Figures 1, 6E:
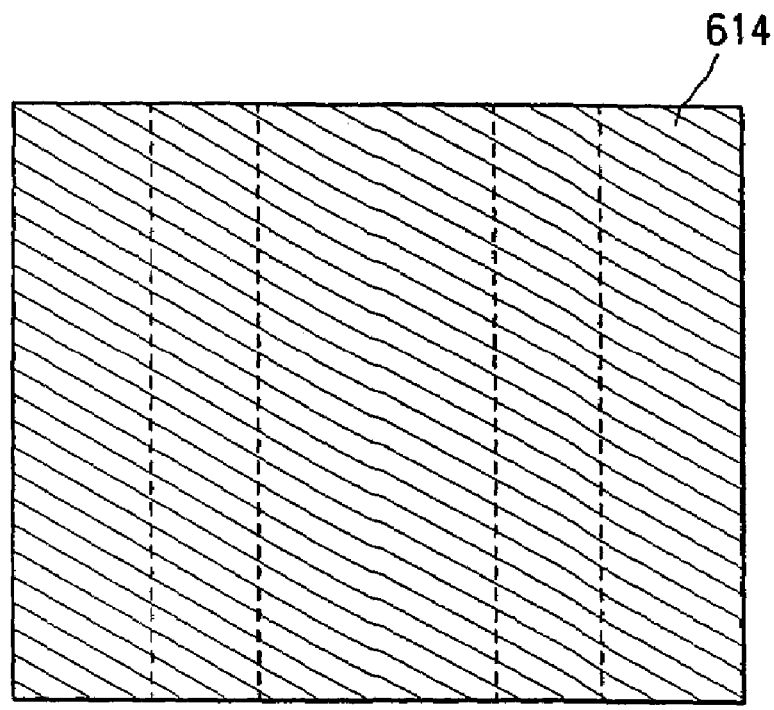
Figures 2, 6E:
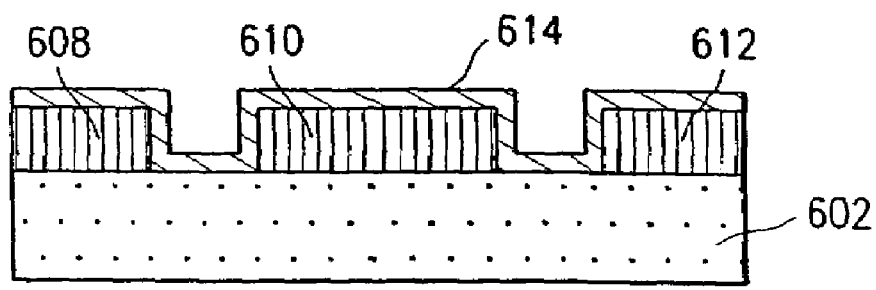
Figures 1, 6F:
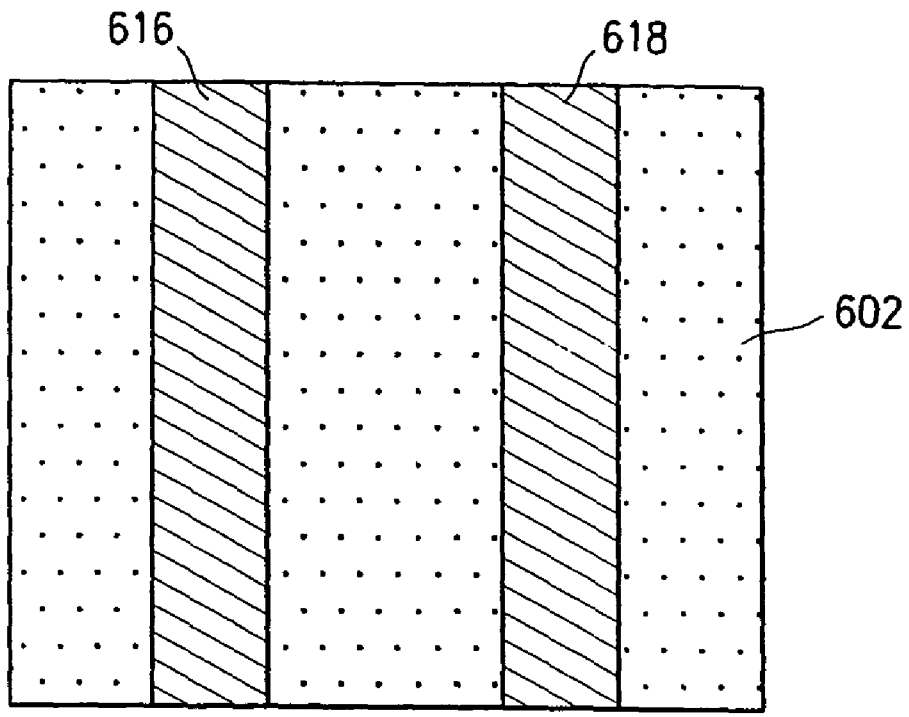
Figures 2, 6F:
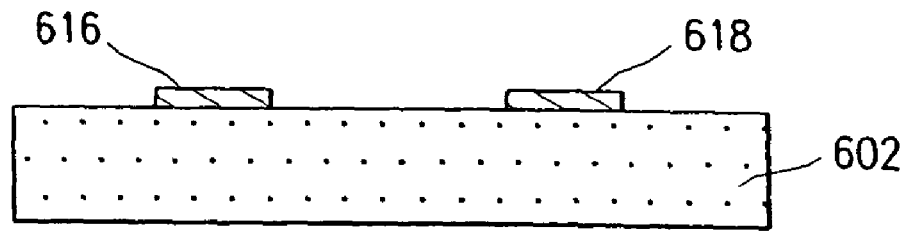

FIGS. 6A-1 through 6F-2 illustrate a further alternative to the process shown in FIGS. 1–4. FIGS. 6A-1 and 6A-2 show a substrate 602. In FIGS. 6B-1 and 6B-2, pattern lines 604 and 606 have been printed onto the substrate 602 using a printable first material. In one embodiment, as shown in FIGS. 6C-1 and 6C-2, the printed substrate is then over-coated with a second material that is not soluble in at least one solvent in which the first printable material is soluble, such that said at least one solvent could be used to strip the first printable material without also stripping the second material. In one embodiment, the printable first material is hydrophobic (i.e., water repelling) and solvent soluble and has a low surface tension. In one embodiment, the second material is water-based and is repelled by the first material, such that the overcoat adheres only to those portions of the substrate not covered by the first material, forming areas 608, 610, and 612 comprising the second (water-based) material. In one alternative embodiment, the second material is not repelled by the first material and the second material may partially or fully overcoat the pattern lines 604 and 606 shown in FIGS. 6C-1 and 6C-2. In one such embodiment, in the regions in which the second material overcoats the first material, the second material may be less thick than in regions in which the second material is applied directly to the substrate (i.e., regions on the substrate in which the first material is not printed). In one embodiment, the first material is stripped using a suitable solvent that does not also strip away the second material, leaving the structure shown in FIGS. 6D-1 and 6D-2, in which the structures 604 and 606 comprising the first material have been stripped away, leaving the structures 608, 610, and 612 comprising the second material on the substrate 602. In one embodiment in which the second material may overcoat, at least in part, the printed first material, portions of the second material so formed on the first material are stripped away along with the portions of the first material on which they are formed, leaving the portions of the second material applied directly to the substrate (i.e., in regions where the first material was not present), as shown in FIGS. 6D-1 and 6D-2. In one embodiment, the solvent used to strip away the first printable material (and, if applicable, portions of the second material formed thereon) comprises an aqueous solution or water. In one embodiment, the solvent used to strip away the first printable material comprises a non-aqueous solvent or solution. Next, as shown in FIGS. 6E-1 and 6E-2, a thin film 614 is formed both on the structures 608, 610, and 612 and on the portions of the substrate 602 not covered by the second material, using one of the thin film materials described above. In one embodiment, the thin film is formed by sputtering, vapor deposition, spraying, or some other suitable technique. Finally, FIGS. 6F-1 and 6F-2 show the thin film structures 616 and 618 that remain after the second material has been stripped away with an appropriate solvent, or another appropriate chemical or mechanical stripping process. In one embodiment, the solvent used to strip away the first material is an aqueous basic solution and the solvent used to strip away the second material is an aqueous acidic solution, an aqueous neutral solution, or water. In one embodiment, the solvent used to strip away the first material is an aqueous acidic solution and the solvent used to strip away the second material is an aqueous basic solution, an aqueous neutral solution, or water. In one embodiment, the solvent used to strip away the first material is an aqueous neutral solution or water and the solvent used to strip away the second material is an aqueous acidic solution or an aqueous basic solution.

Under the process shown in FIGS. 6A-1 through 6F-2, the printed pattern of the first material comprises a positive image of the thin film structures to be formed. Once the first material has been stripped away, as described above, the remaining second material comprises a negative image of the thin film structures to be formed. In a sense, the first material may be considered a mask that may be used to define areas having very small dimensions, such as very fine lines, in which the thin film structures will not be present. While it may be difficult with practically useful printing techniques, such as flexographic, to print such narrow lines in the first instance, for example because of physical limitations, spreading of the ink after printing, etc., such techniques may be used readily to print less fine lines or less small areas with only small gaps separating the lines or areas. A second material such as described above may then be used to fill in the narrow spaces between the areas covered by the first material, which first material may then be stripped away using an appropriate solvent, leaving behind very fine lines or other shapes comprising the second material, which very fine lines or shapes it may not have been practical to print in the first instance. These lines may then be used, as described above, as a negative image for the formation of adjacent thin film structures separated by very narrow gaps, for example.

In one embodiment, a physical stripping process such as peeling is used to reveal the patterned thin film structures. For example, an adhesive tape having an appropriate cohesion strength and adhesion strength to ITO is laminated onto an ITO/PET film pre-printed with a masking coating/ink. A subsequent peeling will remove the ITO either on the area printed with masking ink or on the area without the ink depending on the cohesion strength of the ink and the adhesion strengths at the ink-PET and ITO-PET interfaces. This stripping technique may be used with any of the processes described above.

In one embodiment, the process of FIGS. 6A-1 through 6F-2 comprises printing a positive image of desired conductive thin film structures on a roll of Melinex 582 polyester (4 mil thick, 14" wide, Dupont Teijin Films, Wilmington, DL) using Film III Warm Red Ink (Environmental Inks and Coatings, Morganton, N.C.) on a Mark Andy 4200 flexographic press. The printed portion of the polyester roll is then coated with a solution consisting of 16 parts of aqueous 10% polyvinyl pyrrolidinone (PVP-90, ISP Technologies, Inc., Wayne, N.J.), 0.40 parts Sunsperse Violet (Sun Chemical, Cincinnati, Ohio), and 16 parts water using a #6 Meyer bar, and dried 1.5 minutes in an oven at 80° C. The film is then placed in a crystallizing dish containing ethyl acetate. A 10"×10"×12.5" ultrasonication bath (BLACKSTONE-NEY, PROT-0512H EP ultrasonic bath driven by a 12T MultiSonik™ generator) is filled with about 4" of water and the dish containing the film is floated in the water and ultrasonicated at 104 KHz for 5 minutes. The film is then removed from the dish and dried 1.5 minutes in an oven at 80° C. At the completion of the drying step, the film has lines of PVP coating that define a negative image of the originally printed positive image. The patterned polyester is next sputter coated with ITO using a CHA Mark 50 roll coater to deposit a 1250 angstroms thick ITO film. The ITO coated patterned polyester is then ultrasonicated for 3 minutes in a beaker containing water placed in a Fisher #FS220H ultrasonicator (Fisher Scientific, Pittsburg, Pa.). The film is then rinsed with de-ionized water and dried by blowing the water off with a stream of air. The resulting film has ITO structures in the shape of the originally printed positive image.

In one embodiment, the process shown in FIGS. 6A-1 through 6F-2 comprises sputter deposition of ITO film on a PET substrate having a hydrophilic coating, e.g., Melinex 582, and printed using warm red ink (Environmental Ink). In one embodiment, this combination of materials allows the ITO to be stripped from undesired areas ultrasonically using a water-based stripper.

In one embodiment, the water based stripper for ITO stripping could be a surfactant solution such as JEM-126 (sodium tripolyphosphate, sodium silicate, nonyl phenol ethoxylate, ethylene glycol monbutyl ether and sodium hydroxide), detergent formulation 409, hydroproxide, and developer Shipley 453, etc.

In one embodiment, the ITO stripping rate depends on the solvent concentration, solvent temperature, and the position of the substrate film relative to the ultrasound transducer.

In one embodiment, prior to the ITO sputter deposition, the ink printed PET surface is pre-treated with an appropriate plasma. In one embodiment, such plasma pretreatment minimizes the generation of micro-cracks on the patterned ITO structures during the ITO stripping process. In addition, such plasma pre-treatment may in one embodiment prevent ITO residue from being generated on the printed ink area as a result of removal of part of the printed ink pattern due to high-energy plasma, which may generate ITO residue on the printed ink area during the stripping process.

In order to eliminate the optical impact of minor ink residue appearing on the stripped ITO surface, in one embodiment a colorless ink printed on the PET surface is preferred.

Any of the foregoing techniques for forming a patterned thin film design on a substrate may be used to form a patterned metallization layer on a plastic substrate to provide an IMD decorated film including such a patterned metallization layer in its design. The techniques are applicable, without limitation, to both in-mold transfer and in-mold insert IMD.

Figure 7:
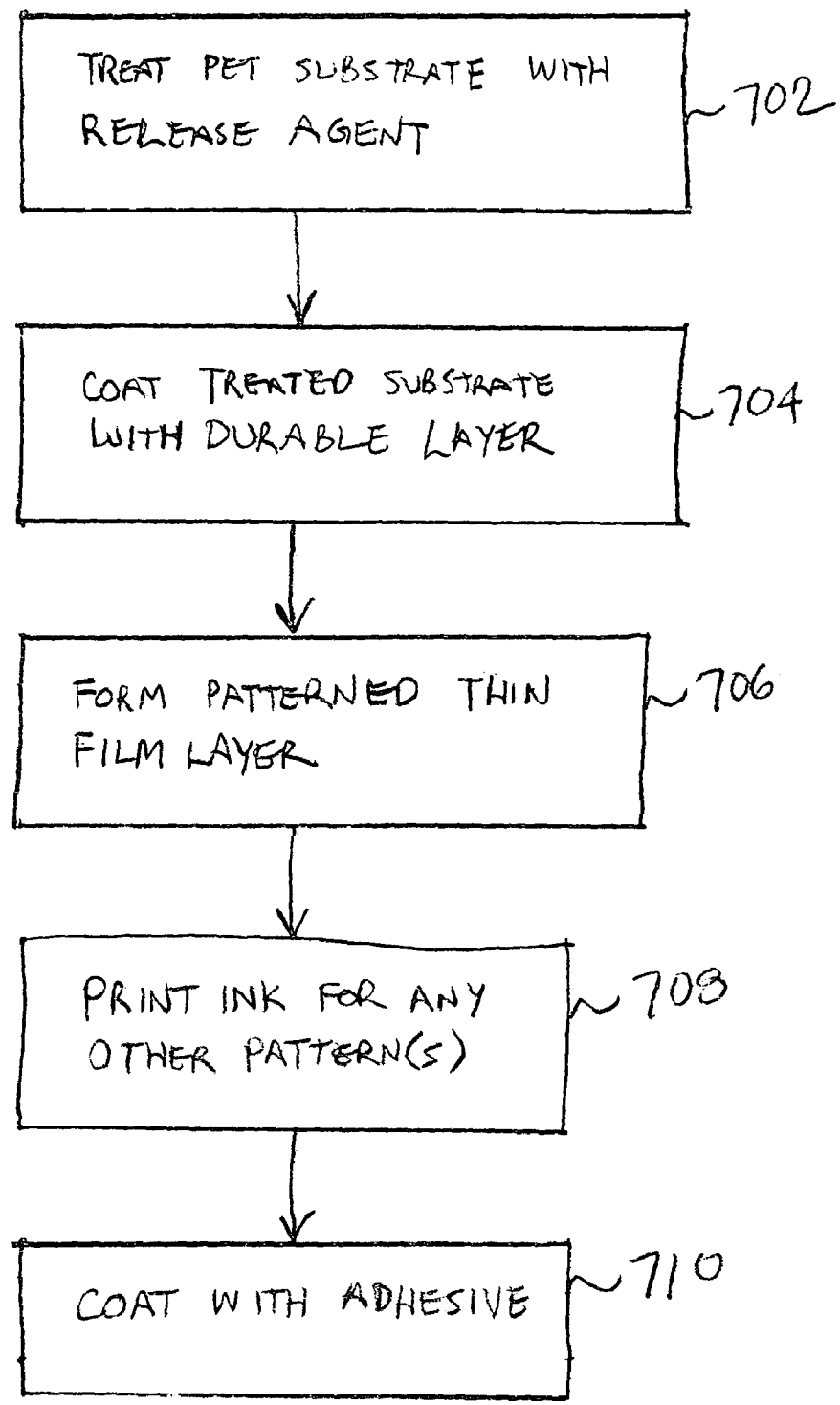
FIG. 7 illustrates typical process steps for the making of an in-mold (transfer) decoration film.

FIG. 7 is a flow chart illustrating a process used in one embodiment to form an in-mold transfer type IMD film, using one or more of the techniques described herein for forming a patterned thin film structure on a substrate. The process begins in step 702, in which a PET substrate is coated with a release layer. In one embodiment, a release layer of about 0.1–3 μm, preferably 0.3–2 μm thickness is coated on a 2 mil PET substrate layer. In step 704, the treated substrate is coated with a durable layer for oil and scratch resistance. In one embodiment, the durable layer is about 2 to 10 microns, preferably 4–8 μm thick. In step 706, a patterned thin film portion of the IMD design is formed. In one embodiment, step 706 comprises one or more of the techniques described above in connection with FIGS. 1 through 6D for forming a patterned thin film structure on a substrate. In one embodiment, step 706 comprises forming a patterned metallization layer on the substrate, using one of the techniques described herein. In step 708, any additional pattern(s) is/are printed on the substrate using any suitable ink for visual effects. The substrate and design are then coated with adhesive in step 710. The resulting IMD decorated film may be used in an in-mold transfer process to transfer the design to the injection-molded item.

Figure 8:
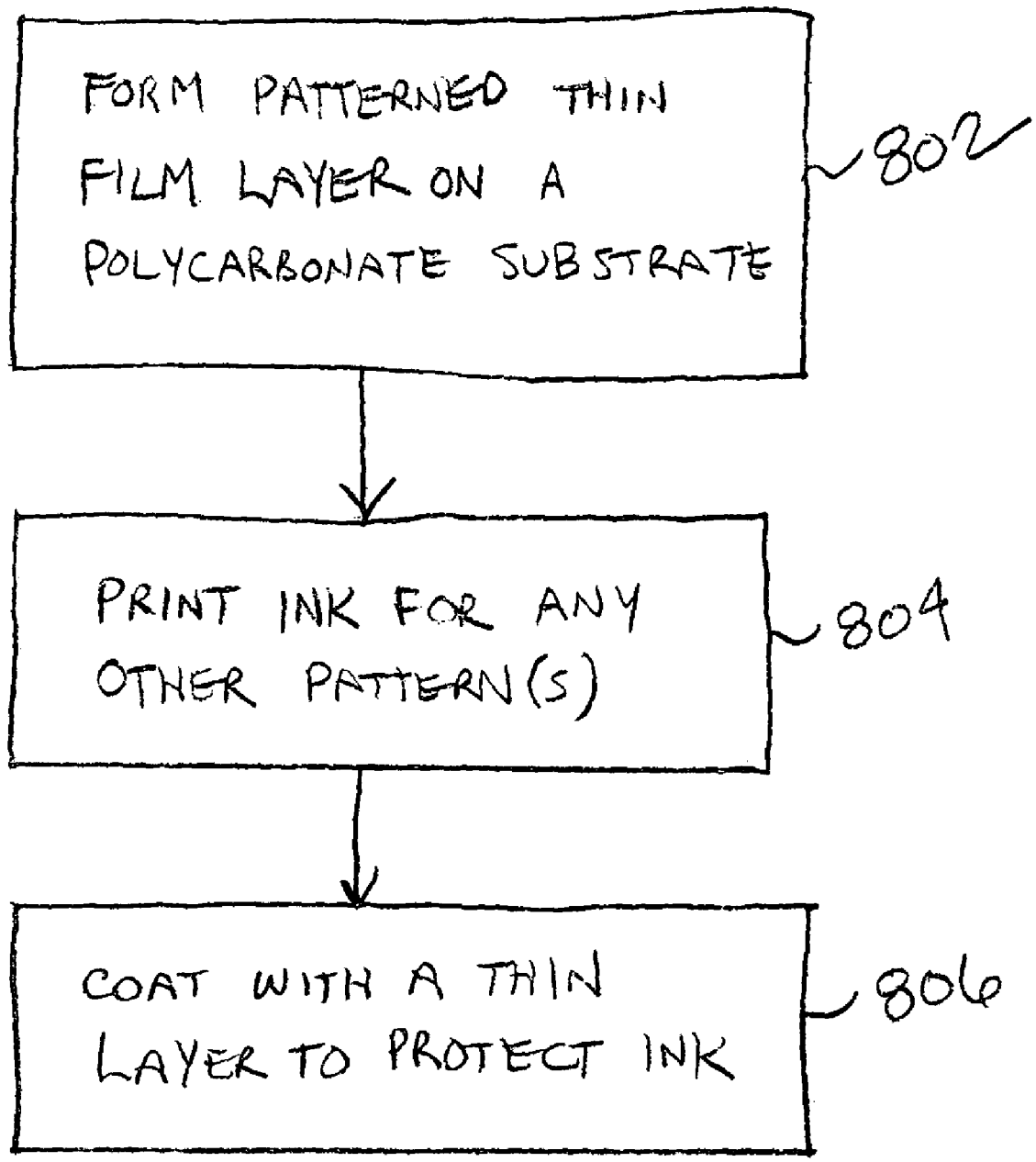
FIG. 8 illustrates typical steps for the making of an in-mold labeling or insertion film.

FIG. 8 is a flow chart illustrating a process used in one embodiment to form an in-mold insert type IMD film, using one or more of the techniques described herein for forming a patterned thin film structure on a substrate. In step 802, a patterned thin film portion of the IMD design is formed on, for example, a polycarbonate (PC) or acrylic (PMMA) substrate. In one embodiment, step 802 comprises one or more of the techniques described above in connection with FIGS. 1 through 6D for forming a patterned thin film structure on a substrate. In one embodiment, step 802 comprises forming a patterned metallization layer on the substrate, using one of the techniques described herein. In step 804, any additional pattern(s) is/are printed on the substrate using any suitable ink. The substrate and design are then coated in step 806 with a thin layer to protect the ink. The resulting IMD decorated film may be used in an in-mold insert process to transfer the design to the injection-molded item.

The additional examples listed below (identified as Embodiments A through F to facilitate comparison) further illustrate the benefits, in terms of the patterning of thin film and the related manufacturing and handling processes, e.g., of including in the masking coating/ink a re-dispersible particulate as described herein, such as in the processes described above in connection with FIGS. 1 through 4B.

In an Embodiment A, the following masking layer composition was used for aluminum (Al) metal thin film patterning: 5.5 grams Celvol 203S (PVA from Celanese, Dallas, Tex., LMW, 87% hydrolysis), 5.5 grams PVP K-30 (from ISP Corp., Wayne, N.J.), and 0.1 grams of Xanthan Gum (from Allchem, Inc., Dalton, Ga.) were dissolved slowly at room temperature into 39.2 grams of de-ionized water. To the masking composition, 0.23 grams of Silwet L-7608 (from OSi Specialties, Middlebury, Conn.), was added. The resultant solution was used as the masking coating/ink for printing a pattern on a substrate for metallization, e.g., as described herein.

In an Embodiment B, the following masking layer composition was used for aluminum (Al) metal thin film patterning: 3.0 grams of 20% dispersed silica (Sylojet 703C, from Grace Davison, Columbia, Md.) was diluted with 36.2 grams of de-ionized water. To this solution, 5.2 grams Celvol 203S, 5.2 grams PVP K-30 and 0.1 grams of Xanthan Gum were added slowly at room temperature then mixed at high shear rate. Finally, 0.23 grams of Silwet L-7608 was added. The resultant solution was used as the masking coating/ink for printing a pattern on a substrate for metallization, e.g., as described herein.

In Embodiments C-F, the same procedure and binders of Embodiment B were used, except that the weight percent of Silica in the dried films were changed to 10% in Embodiment C, 30% in Embodiment D, 60% in Embodiment E, and 80% in Embodiment F.

For purposes of comparison, all of the masking solutions in the above-described Embodiments A–F were screen printed on to a 2 mil Melinex 453 PET film (ICI, UK) through a 330 mesh stencil to form a negative masking pattern. The roll-up properties of the printed film were evaluated by the blocking resistance at ambient and 50° C./80% RH conditions. The printed PET film was uniformly coated with an Al layer of 50 to 60 nm thickness by vapor deposition. Positive Al pattern was developed in water by selectively stripping off the Al layer on the masking layer to generate positive Al pattern on the area that was not printed with the masking layer. The stripability or stripping selectivity is determined by the sharpness and shininess of the resultant Al image. The results are listed in Table 1 below (with the embodiment to which the data in each row applies indicated by the letter in the first column):

In one embodiment, an in-mold decoration film, such as described above in connection with FIG. 7, comprises a durable layer prepared as follows: 500 grams of 20% Elvacite 2041 (PMMA resin from Lucite International, Inc.) in MEK/cyclohexanone (weight ratio=9:1) were mixed thoroughly with 320 grams of 25% EB1290 (from UCB Chemicals) in MEK/cyclohexanone (weight ratio=9:1). To this solution, 67 grams of MEK-ST (from Nissan Chemical) was added with mechanical agitation. Finally, 24 grams of 25% photo-initiator (Irgacure 907/Irgacure 1800 (=1:1, w/w, from Ciba Specialty Chemicals) in MEK/cyclohexanone (weight ratio=9:1) and 89 grams of MEK/cyclohxanone (weight ratio=9:1) were added with agitation for additional 30 minutes. The solution was coated on the release layer coated film with a #22 wired rod and the coating was dried in air for 30 min. and then at 65° C. for 10 min. to produce a 6–7 μm (dry) thick durable layer coating.

In one embodiment, an in-mold decoration film, such as described above in connection with FIG. 7, comprises a patterned aluminum layer formed as follows: The durable layer prepared as described in the paragraph immediately above was printed with the masking layer of Embodiment C described above by screen printing, coated with an Al layer of about 60 nm thick by vapor deposition, and a shiny, high resolution Al pattern was developed by rinsing with water to remove the Al on the printed masking layer.

In one embodiment, the adhesive layer comprising an in-mold decoration film, such as described above in connection with FIG. 7, comprises an adhesive layer prepared as follows: 2.5 grams of Sancure 2710 (from Noveon Inc., Cleveland, Ohio) and 7.5 grams of DI water were mixed thoroughly and coated onto a patterned Al layer prepared as

TABLE 1

| | Binder PVA/PVP K-30 (1:1) | Silica (wt % in dried film) | Screen Printing quality | Film Blocking at ambient condition | Film Blocking after aging in 50° C./80% RH | Stripability of Al by Water |
|---|---|---|---|---|---|---|
| A | 97 | 0% | Good | Blocking | Blocking severely | Good |
| B | 92 | 5% | Good | Excellent | Good | Good |
| C | 87 | 10% | Good | Excellent | Excellent | Excellent |
| D | 67 | 30% | Good | Excellent | Excellent | Excellent |
| E | 37 | 60% | Good | Excellent | Excellent | Excellent |
| F | 17 | 80% | Fair | Excellent | Excellent | Fair-Good |

It can be seen from Table 1 that the addition of the particulate silica from 5 wt % to 80 wt % based on the dried masking film improves significantly both blocking resistance of the masking layer and the stripability of the Al layer on the masking layer. The presence of the particulate dispersion in the masking layer also resulted in highly shiny Al lines with fine line width and excellent integrity.

In one embodiment, an in-mold decoration film, such as described above in connection with FIG. 7, comprises a release layer prepared as follows: 15.0 grams of CYMEL 303ULF (from Cytec Industries Inc., West Paterson, N.J.) and 105 grams of MEK were mixed at 600 rpm for 5 minutes. 0.3 grams of CYCAT600 (from Cytec Industries Inc., West Paterson, N.J.) were added and stirred at 600 rpm for another 5 minutes. The resultant solution was then filtered with 0.2 micron filter and coated onto a 1.42 mil PET (SH22, from SKC, South Korea) with a #4 Meyer bar for a targeted thickness of 1 μm. The coated film is then air dried for 5 minutes and baked in oven at 130° C. for 10 minutes.

described in the paragraph immediately above using a #16 Meyer bar with a targeted thickness of 2 to 3 μm. The coated film was then dried in oven at 90 degree C. for 1 minute.

In one embodiment, a multilayer film formed as described in the four paragraphs immediately above was fed into an injection mold, and PMMA resin was injection molded onto the adhesive layer. The durable layer and patterned Al layer were transferred completely onto the molded pieces after the release film was peeled off.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A process for forming a patterned thin film structure on a substrate, comprising:
   printing on the substrate with a first material a pattern defining a positive image of a decorative design to be formed on the substrate such that the first material is printed in the area where the thin film structure is to be formed, the first material being strippable using a first solvent;
   overcoating the printed surface of the substrate with a second material that is not strippable using the first solvent;
   stripping the first material away using the first solvent in a process that strips away the first material and the second material formed on the first material without stripping away the second material formed directly on the substrate, such that the second material remains coated on the substrate where the first material was not present, thereby defining a negative image of the decorative design to be formed on the substrate such that the second material remains in the area where the thin film structure is not to be formed;
   depositing a thin film material on the patterned substrate; and
   stripping to remove the second material and the thin film material deposited on the second material to form the thin film structure in the shape of the decorative design;
   wherein the substrate and the patterned thin film structure formed thereon are suitable for use as an IMD decorated film.

2. The process for forming a patterned thin film structure on a substrate as recited in claim 1, wherein the first material repels the second material such that the second material fills in the areas of the substrate where the first material has not been printed without coating the areas where the first material is present.

3. The process for forming a patterned thin film structure on a substrate as recited in claim 1, wherein the first solvent is an aqueous solution or water.

4. The process for forming a patterned thin film structure on a substrate as recited in claim 1, wherein the first solvent is a non-aqueous solvent or solution.

5. The process for forming a patterned thin film structure on a substrate as recited in claim 1, wherein the first solvent is an aqueous basic solution, and the step of stripping the second material comprises using a second solvent comprising an aqueous acidic solution, an aqueous neutral solution, or water.

6. The process for forming a patterned thin film structure on a substrate as recited in claim 1, wherein the first solvent is an aqueous acidic solution and the step of stripping the second material comprises using a second solvent comprising an aqueous basic solution, an aqueous neutral solution, or water.

7. The process for forming a patterned thin film structure on a substrate as recited in claim 1, wherein the first solvent is an aqueous neutral solution or water and the step of stripping the second material comprises using a second solvent comprising an aqueous acidic solution or an aqueous basic solution.

* * * * *